(12) United States Patent
Lim et al.

(10) Patent No.: US 7,629,189 B2
(45) Date of Patent: Dec. 8, 2009

(54) LIQUID CRYSTAL DISPLAY DEVICE AND METHOD FOR FABRICATING THE SAME

(75) Inventors: Kyoung Nam Lim, Gyeongsangbuk-do (KR); Ji Hyun Jung, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 100 days.

(21) Appl. No.: 11/637,053

(22) Filed: Dec. 12, 2006

(65) Prior Publication Data
US 2007/0138471 A1   Jun. 21, 2007

(30) Foreign Application Priority Data
Dec. 14, 2005   (KR) ............. 10-2005-0123389

(51) Int. Cl.
H01L 27/14   (2006.01)
(52) U.S. Cl. ................ 438/34; 257/59; 257/E27.132
(58) Field of Classification Search ............. None
See application file for complete search history.

(56) References Cited
U.S. PATENT DOCUMENTS

| 5,478,766 A | | 12/1995 | Park et al. | |
| 5,751,020 A | * | 5/1998 | Lyu | 257/72 |
| 6,025,605 A | * | 2/2000 | Lyu | 257/59 |
| 6,800,872 B2 | * | 10/2004 | Tanaka et al. | 257/59 |
| 6,853,405 B2 | * | 2/2005 | Lee | 349/39 |
| 2004/0046924 A1 | * | 3/2004 | Kim et al. | 349/187 |
| 2004/0105067 A1 | * | 6/2004 | Kim et al. | 349/187 |
| 2008/0012017 A1 | * | 1/2008 | Jung | 257/59 |

FOREIGN PATENT DOCUMENTS

| CN | 1606162 A | 4/2005 |
| JP | 2001-223363 | 8/2001 |
| KR | 2005-0035011 | 4/2005 |
| KR | 2005-0093881 | 9/2005 |

* cited by examiner

Primary Examiner—Sue Purvis
Assistant Examiner—Benjamin P Sandvik
(74) Attorney, Agent, or Firm—McKenna Long & Aldridge

(57) ABSTRACT

A liquid crystal display device and a fabricating method thereof for securing aperture ratio are disclosed. In the liquid crystal display device, a gate line is formed. A data line crosses the gate line. A thin film transistor is provided at an intersection of the gate line and the data line. A semiconductor pattern is overlapped with the data line under the data line, and includes an active layer of the thin film transistor. A step coverage does not exist between an etched edge surface of the semiconductor pattern disposed at a lower portion of the data line and an etched edge surface of the data line.

8 Claims, 33 Drawing Sheets

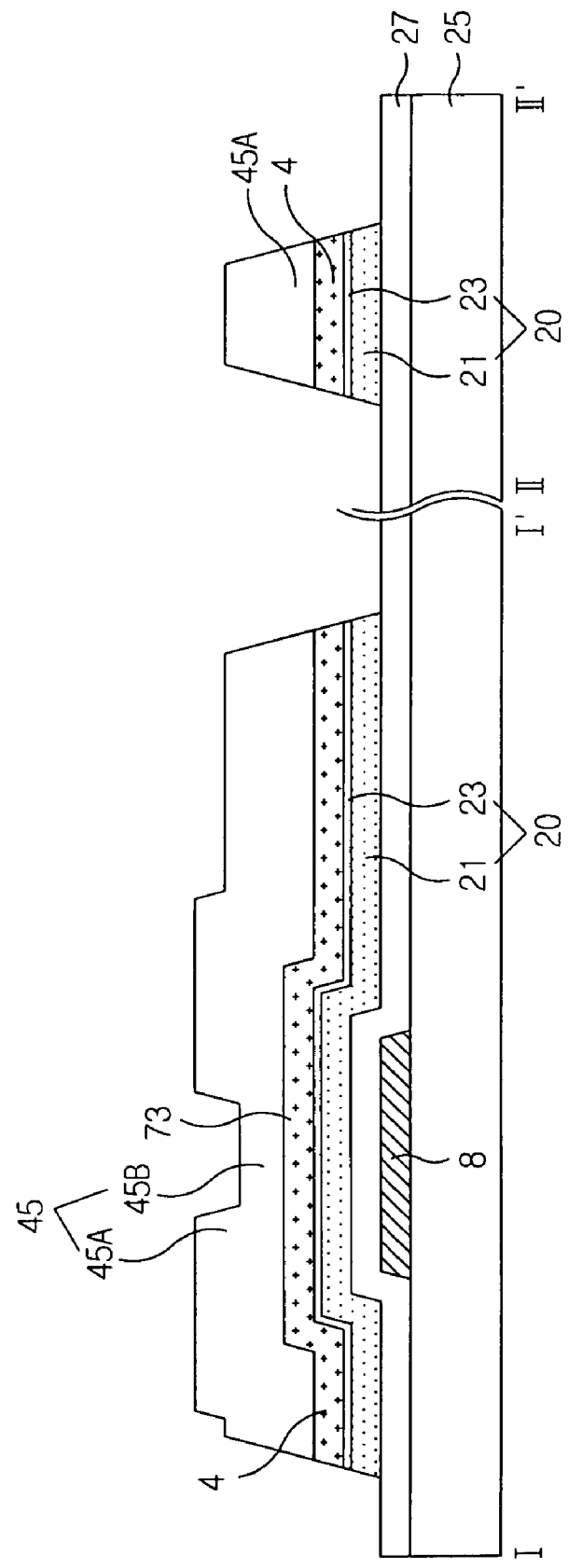

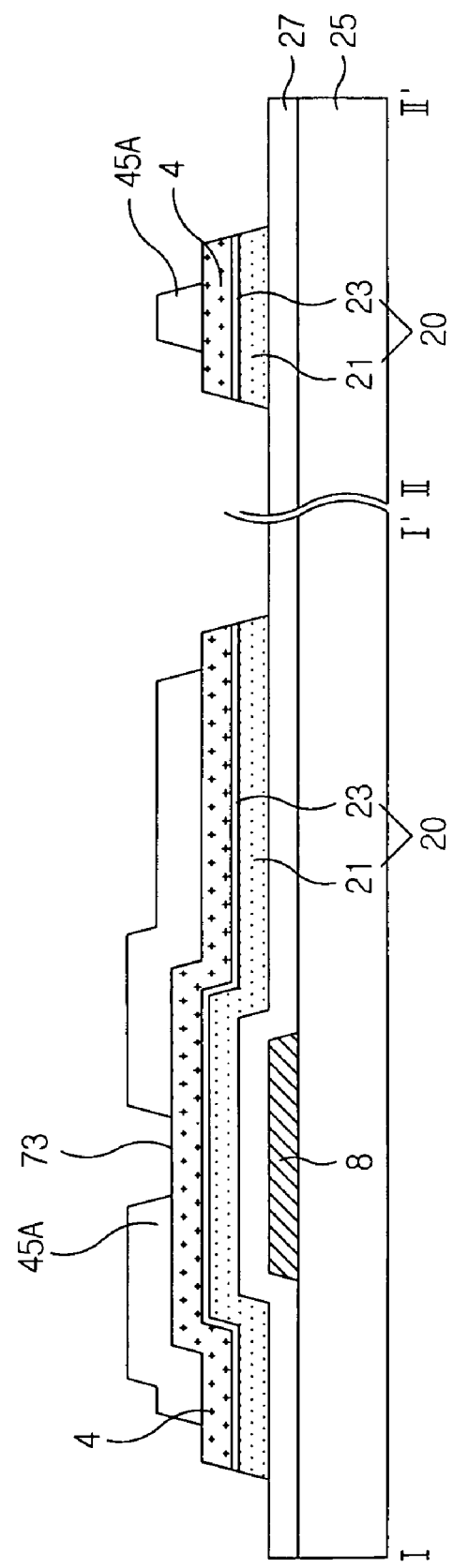

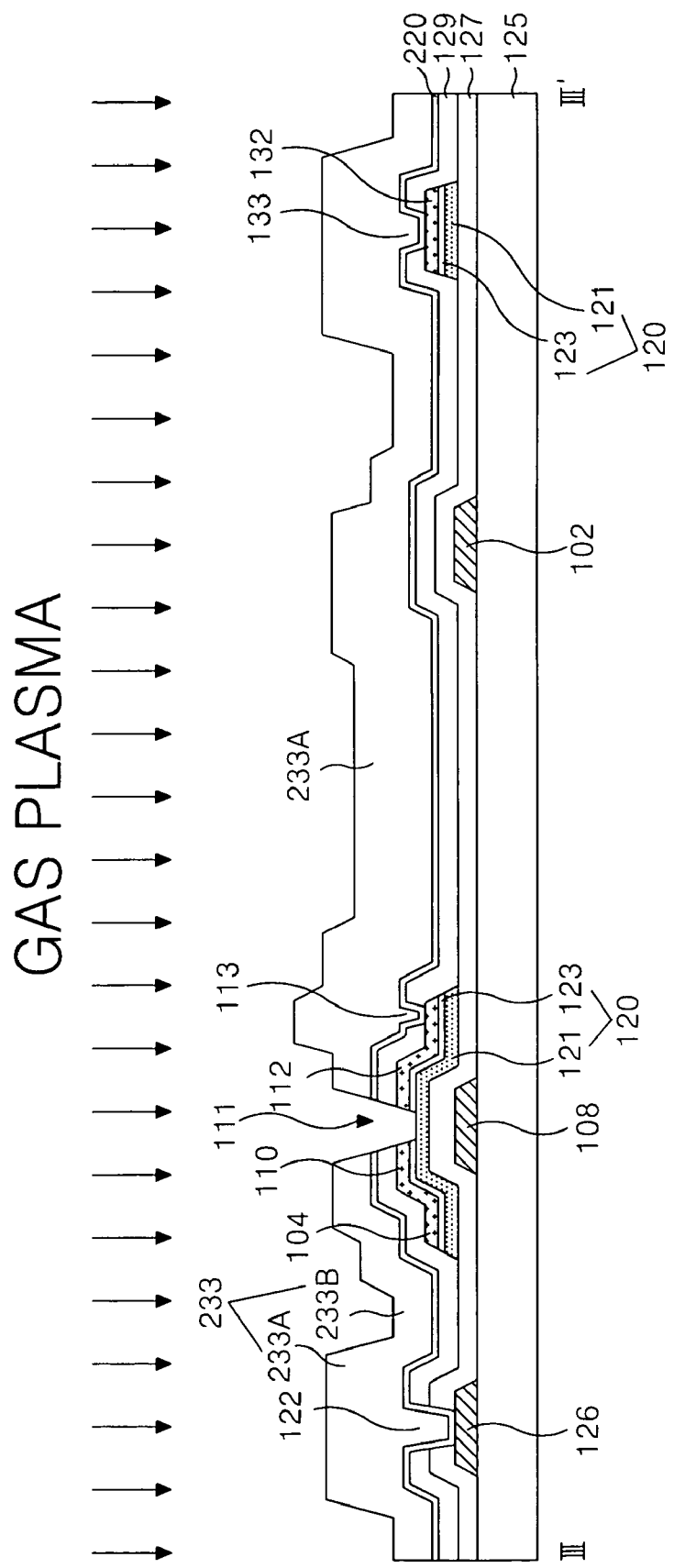

LIQUID CRYSTAL DISPLAY DEVICE AND METHOD FOR FABRICATING THE SAME

This application claims the benefit of Korean Patent Application No. P05-0123389, filed on Dec. 14, 2005, which is hereby incorporated by reference for all purposes as if fully set forth herein.

BACKGROUND OF THE INVENTION

1. Field of the Invention

The present invention relates to a liquid crystal display device, and more particularly to a liquid crystal display device and method for fabricating the same for increasing aperture ratio.

2. Discussion of the Related Art

Generally, a liquid crystal display device controls light transmittance of liquid crystal using an electric field to thereby display a picture. Such a liquid crystal display device drives liquid crystal using an electric field. Herein, the electric field is provided between a pixel electrode and a common electrode opposing each other on an upper and lower substrate of a liquid crystal display device.

The liquid crystal display device may include a thin film transistor array substrate (a lower plate) and a color filter array substrate (an upper plate) opposite each other, liquid crystal between the two substrates, and a spacer for cell gap between two substrates.

The thin film transistor array substrate may be comprised of a plurality of signal lines, a thin film transistor, and an alignment film coated thereon for aligning liquid crystal. The color filter array substrate may be comprised of a color filter for implementing color, a black matrix for preventing light leakage, and an alignment film coated thereon for aligning liquid crystal.

In such a liquid crystal display, the thin film transistor array substrate may have a complex fabrication process leading to an increase in manufacturing cost of the liquid crystal display panel because it involves a semiconductor process and a plurality of mask processes. To solve this, the thin film transistor array substrate has been manufactured with a reduced number of mask processes. One mask process may include a lot of processes such as thin film deposition, cleaning, photolithography, etching, photo-resist stripping and inspection processes, etc. Recently, a four-round mask process has been developed excluding one mask process from the existent five-round mask process that was a standard mask process of the thin film transistor array substrate.

FIG. 1 is a plan view showing a portion of a thin film transistor array substrate using a related art four-round mask process, and FIG. 2 is a sectional view of the thin film transistor array substrate taken along I-I', II-II' in FIG. 1.

Referring to FIG. 1 and FIG. 2, the thin film transistor array substrate includes a gate line 2 and a data line 4 provided on a lower substrate 25 to intersect each other with a gate insulating film 27 therebetween, a thin film transistor 6 provided at each gate and data line intersection, a pixel electrode 14 provided at a pixel area, and a storage capacitor (not shown) provided at an overlapped portion between the gate line 2 and the pixel electrode 14.

The gate line 2 and the data line 4 substantially cross each other to define a pixel area. Herein, the gate line 2 is supplied with a gate signal, and the data line 4 is supplied with a data signal.

The thin film transistor 6 allows a pixel signal applied to the data line 4 to be charged into the pixel electrode 14 and kept in response to a gate signal applied to the gate line 2. The thin film transistor 6 may include a gate electrode 8 connected to the gate line 2, a source electrode 10 connected to the data line 4, a drain electrode 12 connected to the pixel electrode 14.

Also, the thin film transistor 6 may further include an active layer 21 overlapping with the gate electrode 8 with a gate insulating film 27 therebetween to define a channel portion 11 between the source electrode 10 and the drain electrode 12. On the active layer 21, an ohmic contact layer 23 for making ohmic contact with the data line 4, the source electrode 10, and the drain electrode 12 is further provided.

The pixel electrode 14 is connected, via a contact hole 13 passing through a protective film 29, to the drain electrode 12 of the thin film transistor 6.

Accordingly, an electric field is formed between the pixel electrode 14 supplied with a pixel signal via the thin film transistor 6 and a common electrode (not shown) supplied with a reference voltage. Liquid crystal molecules arranged between the thin film transistor array substrate and the color filter array substrate are rotated by the electric field due to dielectric anisotropy. Light transmittance of the pixel area varies depending upon a rotation extent of the liquid crystal molecules to implement a gray level scale.

The storage capacitor (not shown) allows a pixel signal charged in the pixel electrode 14 to be stably maintained until the next signal is charged.

Hereinafter, a method of fabricating the thin film transistor array substrate having the above-mentioned structure adopting the four-round mask process will be described in detail with reference to FIG. 3A to FIG. 3H.

Referring to FIG. 3A, a first conductive pattern group including the gate electrode 8 is provided on the lower substrate 25 by the first mask process.

More specifically, a gate metal layer is formed on the lower substrate 25 by a deposition technique such as sputtering, etc. Next, the gate metal layer is patterned by photolithography and an etching process using a first mask to form the first conductive pattern including the gate electrode 8. Herein, the gate metal layer may be made from an aluminum group metal, etc.

Referring to FIG. 3B, the gate insulating film 27, an amorphous silicon layer 51, a n+ amorphous silicon layer 53, and a source/drain metal layer 41 are sequentially provided on the lower substrate 25 provided with the first conductive pattern by deposition techniques such as plasma enhanced chemical vapor deposition (PECVD) and sputtering, etc. Herein, the gate insulating film 27 may be formed from an inorganic insulating material such as silicon oxide (SiOx) or silicon nitride (SiNx).

Next, a photo-resist 43 is formed on the source/drain metal layer 41, and then a second mask 50 is aligned at an upper portion of the lower substrate 25. The second mask 50 is comprised of a transmitting area P1 exposing ultraviolet light, a partial transmitting area P2 partially transmitting ultraviolet light, and a shielding area P3 shielding ultraviolet light. The partial transmitting area P2 of the second mask 50 may include a diffractive exposing portion or a half transmitting portion to partially transmit ultraviolet light.

The photo-resist 43 is exposed and developed by the second mask 50 to provide a photo-resist pattern 45 having step coverage at a portion corresponding to the shielding area P3 and the partial transmitting area P2 of the second mask 50 as shown in FIG. 3C. In other words, a second photo-resist pattern 45B provided at the partial transmitting area P2 has a substantially lower height than a first photo-resist pattern 45A provided at the shielding area P3.

The source/drain metal layer 41, the n+ amorphous silicon layer 53 provided at a lower portion of the source/drain metal layer 41, and the amorphous silicon layer 51 are sequentially etched and removed by the photo-resist pattern 45. A semiconductor pattern 20 is formed at the data line 4, a source-drain metal pattern 73, and a lower portion of the source-drain metal pattern 73 if the source/drain metal layer 41, the n+ amorphous silicon layer 53, and the amorphous silicon layer 51 are sequentially removed by the photo-resist pattern 45 as shown in FIG. 3D.

Next, the photo-resist pattern 45 is ashed by an ashing process using plasma gas resulting in a thinned first photo-resist pattern 45A, and is removed by the second photo-resist pattern 45B as shown in FIG. 3E. The second photo-resist pattern 45B and both sides of the first photo-resist pattern 45A are simultaneously removed by the ashing process. The source-drain metal pattern 73 and the data line 4 are removed by a wet-etching process using the first ashed photo-resist pattern 45A as shown in FIG. 3E. Herein, the source-drain metal pattern 73 and the data line 4 are exposed by the ashing process of the photo-resist pattern 45. The source-drain metal pattern 73 exposed by the ashing process is removed to provide the source electrode 10 and the drain electrode 12, and to expose the removed source-drain metal pattern 73 and the ohmic contact layer 23 under the data line 4.

The exposed ohmic contact layer 23 is removed by dry-etching using the first ashed photo-resist pattern 45A as shown in FIG. 3F, and the channel portion 11 of the thin film transistor is formed.

Next, the first photo-resist pattern 45A is removed by a stripping process as shown in FIG. 3G with reference to "d1." The first photo-resist pattern 45A is left on the source electrode 10, the drain electrode 12, and the data line 4 (not shown).

Referring to FIG. 3B to FIG. 3G, the semiconductor pattern 20, the channel portion 11 of the thin film transistor, the source electrode 10, and the drain electrode 12 can be formed by one mask process using the photo-resist pattern 45 having step coverage. However, both sides of the data line 4, the source-drain metal pattern 43, and the ohmic contact layer 23 are again etched by the first ashed photo-resist pattern 45A. As a result, the source electrode 10, the drain electrode 12, the ohmic contact layer 23, and the active layer 21 under them 10, 12, and 23 have a constant step coverage taking a stepwise shape.

Referring to FIG. 3H, a second conductive pattern group is formed at the gate insulating film 27 by the second mask process. Herein, the second conductive pattern group includes the source electrode 10, the drain electrode 12, the channel portion 11, and the data line 4. Next, the protective film 29 including the contact hole 13 is formed on the gate insulating film 27 by a third mask process. The pixel electrode 14 is formed on the protective film 29 including the contact hole 13 by a fourth mask.

More specifically, the protective film 29 is entirely formed on the gate insulating film 27 provided with the second conductive pattern group by a deposition technique such as PECVD, etc. Next, the protective film 29 is patterned by a photolithography process and an etching process using the third mask to provide the contact hole 13. The contact hole 13 passes through the protective film 29 to expose the drain electrode 12.

A transparent conductive film is disposed on the protective film 29 by a deposition technique such as sputtering, etc. Next, the transparent conductive film is patterned by a photolithography process and an etching process using the fourth mask to provide the pixel electrode 14. The pixel electrode 14 is electrically connected, via the contact hole 13, to the drain electrode 12.

As described above, the related art thin film transistor array substrate and the fabricating method thereof adopt a four-round mask process to reduce the overall number of processes and hence reduce manufacturing cost in proportion to the reduction in the number of processes when compared to a five-round mask process.

A liquid crystal display device such as that used in a notebook, etc requires a screen brightness of approximately 500 nit ($cd/m^2$). A liquid crystal display device manufactured by a related art five-round mask process has a screen brightness of approximately 500 nit ($cd/m^2$) sufficient for a consumer. However, a liquid crystal display device manufactured by a four-round mask process has an aperture ratio approximately 2% lower than the liquid crystal display device manufactured by the related art five-round mask process owing to a width (d1) of step coverage formed at both sides of the data line 4 as shown in FIG. 3G and FIG. 3H. As a result, it is difficult to produce a screen brightness of approximately 500 nit ($cd/m^2$) by the four-round mask process.

The width (d1) of step coverage formed at both sides of the data line 4 decreases aperture ratio. The reason will be described in detail with reference to FIG. 2 and FIG. 4. Herein, the data line 4 is provided by the four-round mask process and the data line 40 is provided by the five-round mask process.

FIG. 4 is a sectional view showing a data line 40 of a thin film transistor array substrate formed by a five-round mask process. The thin film transistor substrate formed by the five-round mask process results from two mask processes. Herein, one mask process forms a semiconductor pattern 30 and the other mask process forms a channel portion (not shown) of the thin film transistor, the source electrode, and the drain electrode (not shown). Since the five-round mask process does not use a mask including a partial transmitting area, a photo-resist pattern having step coverage is not formed, and an ashing process is not required. Accordingly, the data line 40 and the semiconductor pattern 30 have no step coverage, and are formed to have a width (d2) of about 3.6 μm to about 4 μm as shown in FIG. 4. Herein, the data line 40 is formed by the five-round mask process, and the semiconductor pattern 30 is formed at a lower portion thereof.

The data line 4 is formed by the four-round mask process including the second mask process as mentioned in FIG. 3B to FIG. 3G. In this case, the data line 4 is formed to have a width (d1) of about 3.6 μm to about 4 μm, and step coverage is provided between the data line 4 and the active layer 21 formed at a lower portion thereof. Herein, the step coverage has a width (d1) of about 1.7 μm at both sides of the data line 4, respectively.

FIG. 5 illustrates an actual step coverage formed between the data line provided by the four-round mask process and the active layer provided at a lower portion thereof.

The data lines 4 and 40, and the semiconductor patterns 20 and 30 disposed at a lower portion thereof are joined to correspond to the black matrix upon joining of the color filter array substrate. A non-aperture area includes a portion corresponding to the black matrix. Thus, the active layer 21 formed at a lower portion of the data line 4 by the four-round mask process has step coverage. Herein, the step coverage has a width (d1) of about 1.7 μm at both sides of the data line 4, respectively. As a result, a non-aperture area covered by the black matrix of the color filter array substrate may be wider than a non-aperture area provided by the five-round mask process. Aperture ratio is reduced as the non-aperture area becomes wide. Thus, an alternative for securing a high aperture ratio is needed.

Also, the active layer 21 formed by the four-round mask process is exposed at both sides of the data line 4. As a result, a screen waves (hereinafter, referred to as "wave noise phenomenon").

SUMMARY OF THE INVENTION

Accordingly, the present invention is directed to a liquid crystal display device and a method for fabricating the same thereof for securing an aperture ratio.

Additional features and advantages of the present invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention as embodied and broadly described herein, a liquid crystal display device according to one aspect of the present invention comprises a gate line; a data line crossing the gate line; a thin film transistor provided at an intersection of the gate line and the data line; and a semiconductor pattern overlapped with the data line under the data line, and including an active layer of the thin film transistor, and wherein step coverage does not exist between an etched edge surface of the semiconductor pattern disposed at a lower portion of the data line and an etched edge surface of the data line.

The thin film transistor may include an exposed active layer of the semiconductor pattern, and a channel protective film oxidizing the exposed active layer.

The liquid crystal display device may further include a lower data pad electrode disposed at an upper portion of the semiconductor pattern, so that step coverage is not generated with an etched edge surface of the semiconductor pattern, and connected to the data line; a protective film covering the lower data pad electrode; a second contact hole passing through the protective film to expose the lower data pad electrode; and an upper data pad electrode connected, via the second contact hole, to the lower data pad electrode.

A method of fabricating a liquid crystal display device according to another aspect of the present invention comprises the steps of forming a first conductive pattern group including a gate line and a gate electrode connected to the gate line on a lower substrate using a first mask; forming a gate insulating film covering the first conductive pattern group; forming a semiconductor pattern having an active layer and an ohmic contact layer, and a second conductive pattern group including a data line overlapped with the semiconductor pattern and a source-drain metal pattern overlapped with the semiconductor pattern on the gate insulating film using a second mask; forming a protective film including a first contact hole covering the semiconductor pattern and the second conductive pattern group, and exposing a portion of the source-drain metal pattern using a third mask; and separating a source electrode and a drain electrode from the source-drain metal pattern, forming a channel portion between the source electrode and the drain electrode, and forming a pixel electrode covering the first contact hole using a fourth mask.

The second mask may include a transmitting area and a shielding area.

A step of using the second mask may include the steps of sequentially disposing an amorphous silicon layer, a n+ amorphous silicon layer, a source/drain metal layer, and a photo-resist on the gate insulating film; forming a photo-resist pattern at a portion corresponding to the shielding area by an exposure process and a development process; sequentially etching the source/drain metal layer exposed by the photo-resist pattern, the n+ amorphous silicon layer provided at a lower portion of the exposed source/drain metal layer, and the amorphous silicon layer to pattern the second conductive pattern group; and stripping the photo-resist pattern.

The invention may further include the step of sequentially etching the source/drain metal layer exposed by the photo-resist pattern, the n+ amorphous silicon layer provided at a lower portion of the exposed source/drain metal layer, and the amorphous silicon layer to pattern the second conductive pattern group and may include the steps of wet-etching the exposed source/drain metal layer; and dry-etching the n+ amorphous silicon layer provided at a lower portion of the exposed source/drain metal layer, and the amorphous silicon layer.

The fourth mask may include a transmitting area, a shielding area, and a partial transmitting area.

A step of using the fourth mask may include the steps of sequentially disposing a transparent conductive film and a photo-resist on the protective film; forming a first photo-resist pattern at a portion corresponding to the shielding area, and a second photo-resist pattern having a substantially lower height than a first photo-resist pattern at a portion corresponding to the partial transmitting area by the exposure process and the development process; etching the transparent conductive film exposed by the first and second photo-resist patterns to expose the protective film; etching the exposed protective film, the source-drain metal pattern provided at a lower portion of the exposed protective film, and an ohmic contact layer to expose the active layer; ashing the first and second photo-resist patterns using a plasma gas to remove the second photo-resist pattern, and to expose the transparent conductive film; etching the exposed transparent conductive film to pattern; and stripping the first photo-resist pattern.

A channel protective film may be formed at an upper portion of the exposed active layer by an ashing process using the plasma gas.

The exposed source-drain metal pattern, and an ohmic contact layer provided at a lower portion of the exposed source-drain metal pattern may be etched by a dry-etching process.

The step of forming the second conductive pattern group may be simultaneously carried out with a step of forming a lower data pad electrode connected to the data line.

The step of forming a protective film including the first contact hole may be simultaneously carried out with a step of forming a second contact hole exposing the lower data pad electrode.

The step of forming the pixel electrode may be simultaneously carried out with a step of forming an upper data pad electrode connected to a lower data pad electrode exposed via the second contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Hereinafter, embodiments of the present invention will be described in reference to the figures.

A liquid crystal display device controls light transmittance of liquid crystal by an electric field to thereby display a picture. Such a liquid crystal display device drives liquid crystal using an electric field. Herein, the electric field is provided between a pixel electrode and a common electrode opposing each other on an upper and lower substrates of a liquid crystal display device.

The liquid crystal display device may include a thin film transistor array substrate (a lower plate) and a color filter array substrate (an upper plate) opposite to each other, liquid crystal between two substrates, and a spacer for cell gap between the two substrates.

The thin film transistor array substrate may be comprised of a plurality of signal lines, a thin film transistor, and an alignment film coated thereon for aligning liquid crystal. The color filter array substrate may be comprised of a color filter for implementing color, a black matrix for preventing light leakage, and an alignment film coated thereon for aligning liquid crystal.

Figure 1:
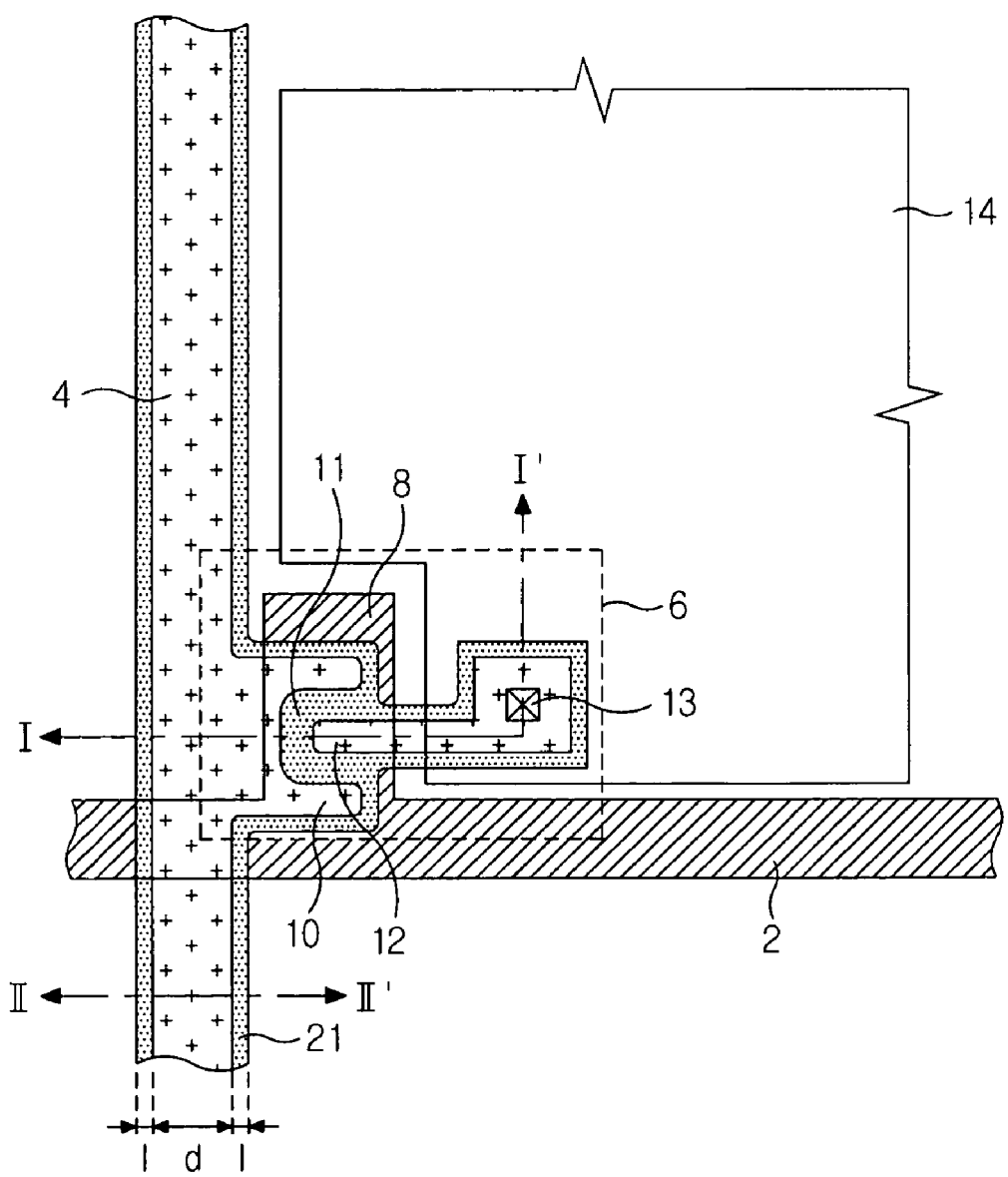
FIG. 1 is a plan view showing a portion of a thin film transistor array substrate of a liquid crystal display device fabricated by a related art four-round mask process.
Figure 2:
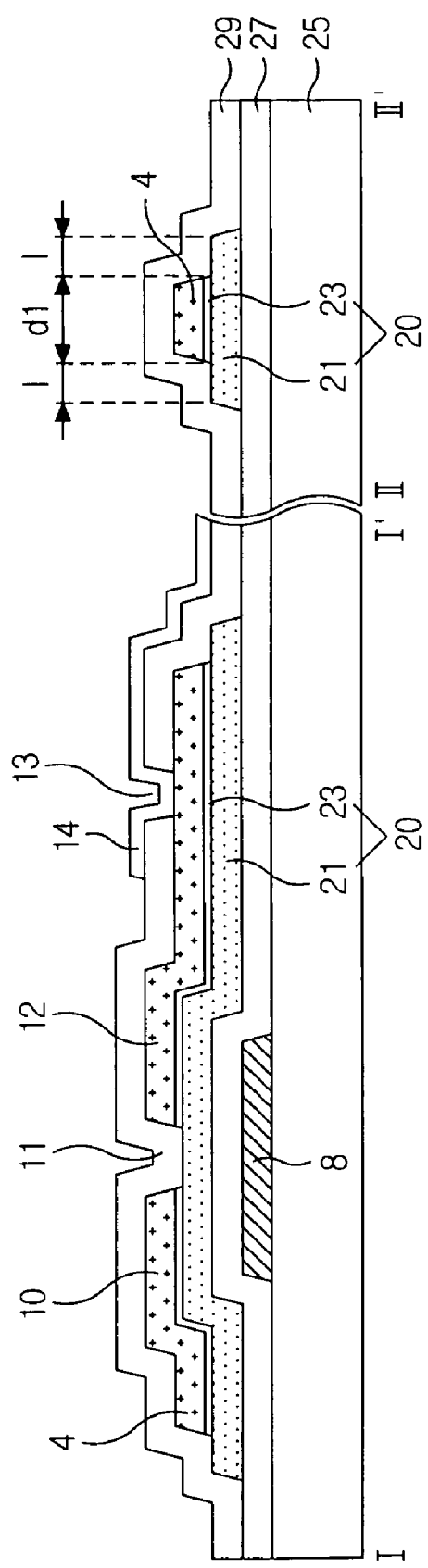
FIG. 2 is a sectional view of the thin film transistor array substrate taken along I-I' and II-II' in FIG. 1.
Figure 3A:
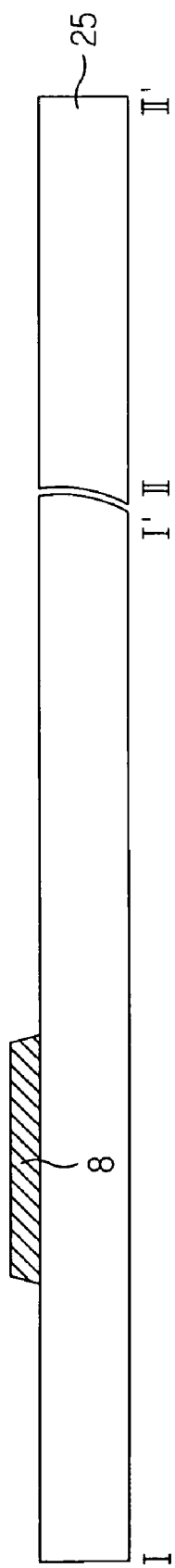
FIG. 3A through and including FIG. 3H are sectional views showing a step by step process of fabricating the thin film transistor array substrate shown in FIG. 1 and FIG. 2.
Figure 3B:
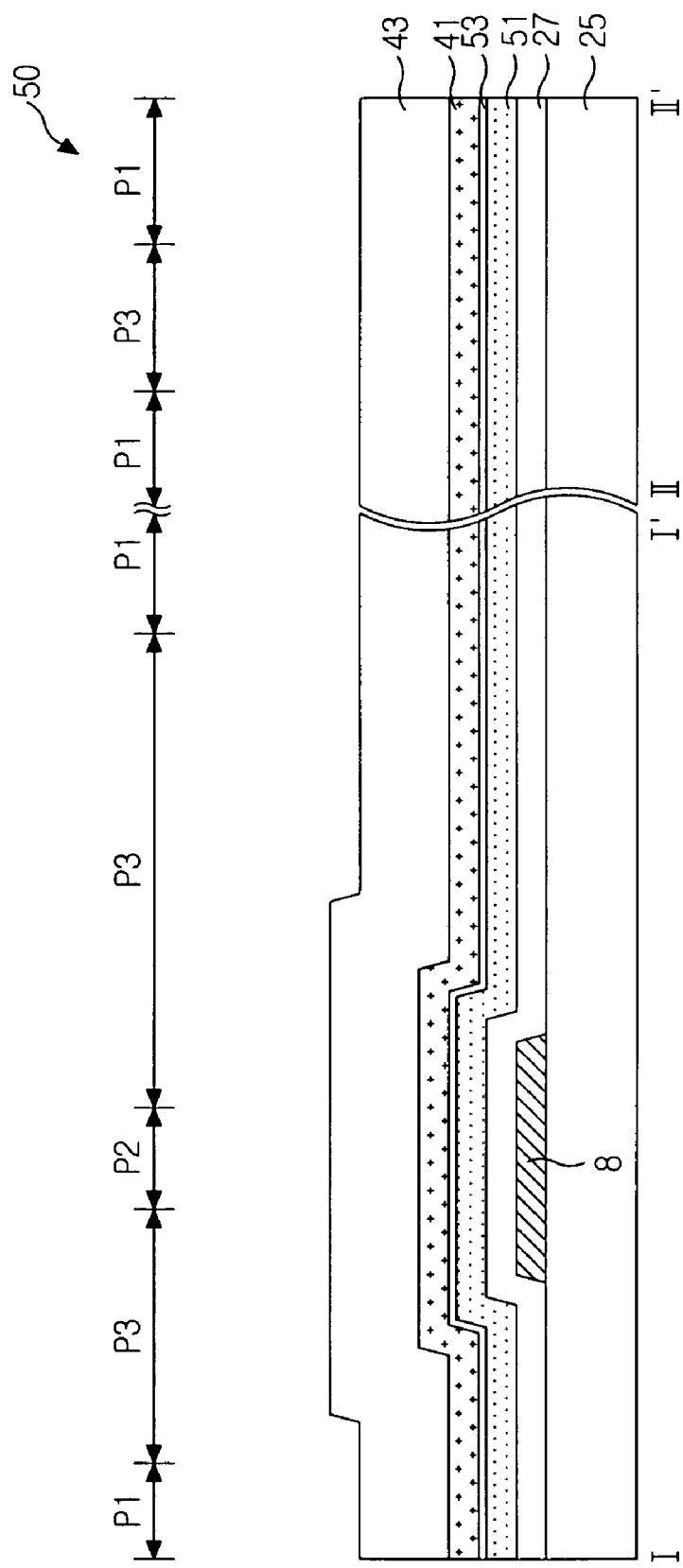
Figure 3C:
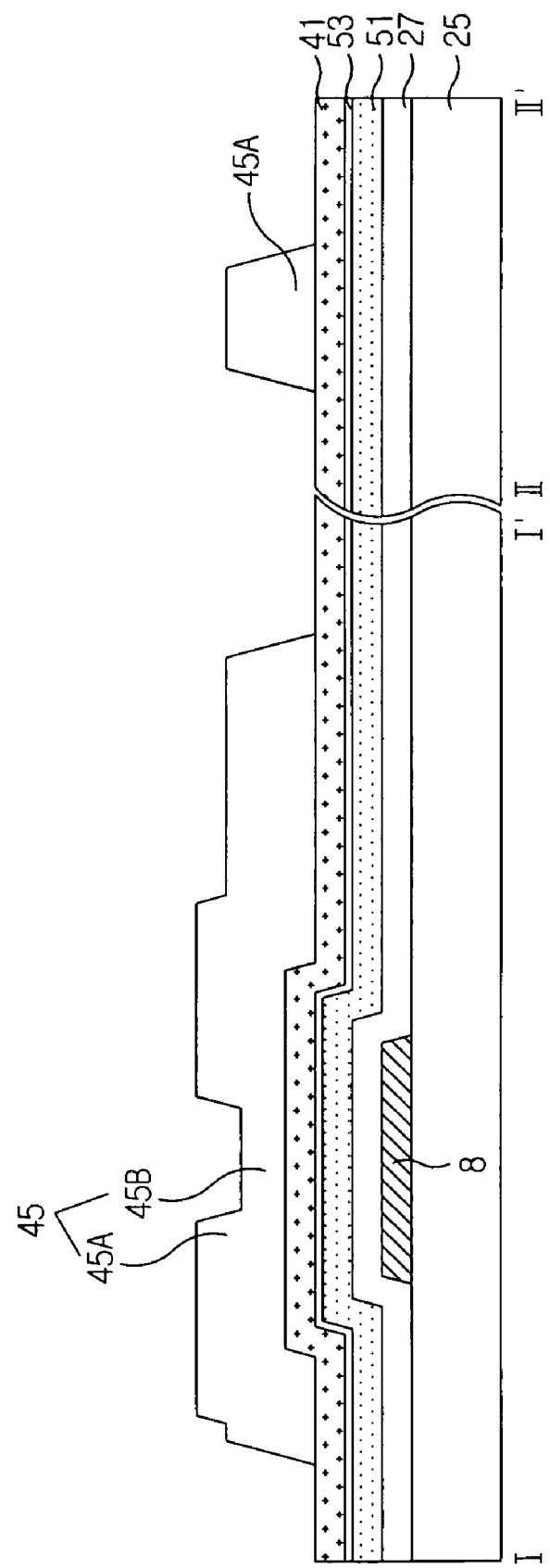
Figure 3F:
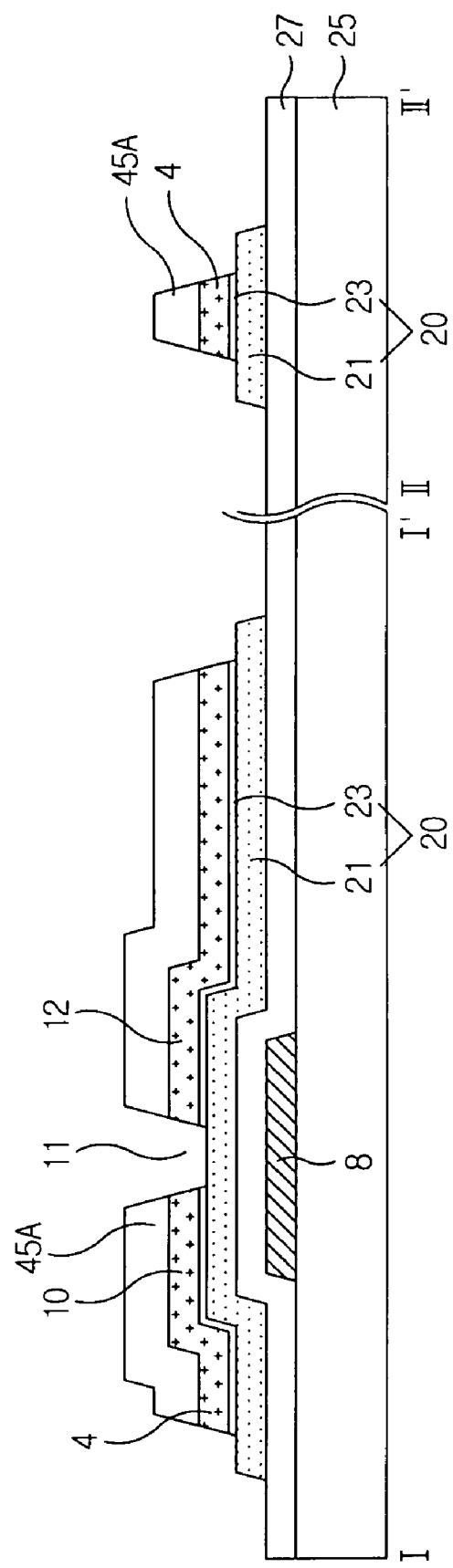
Figure 3G:
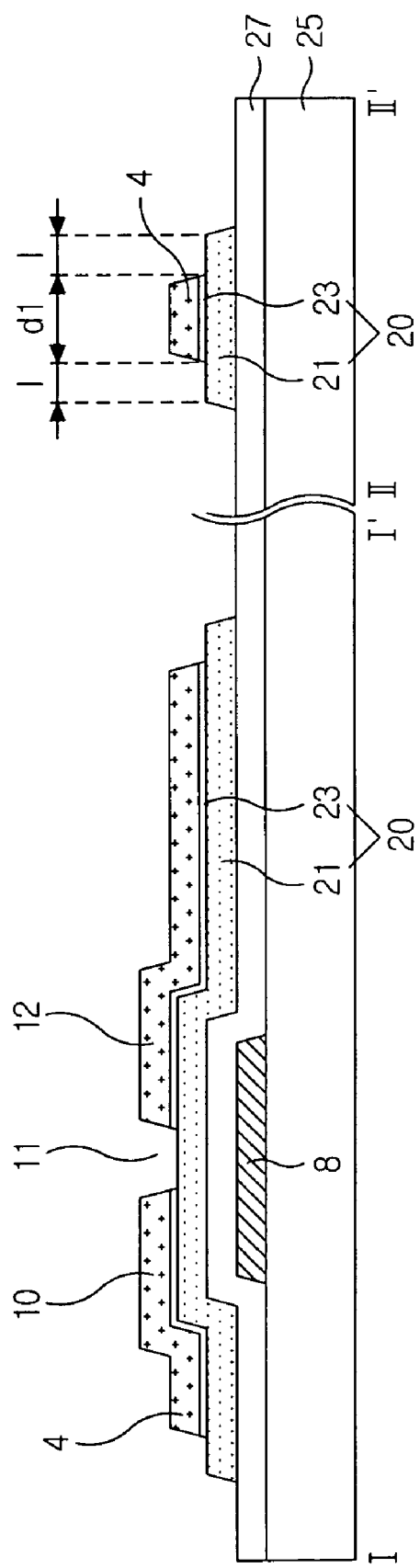
Figure 3H:
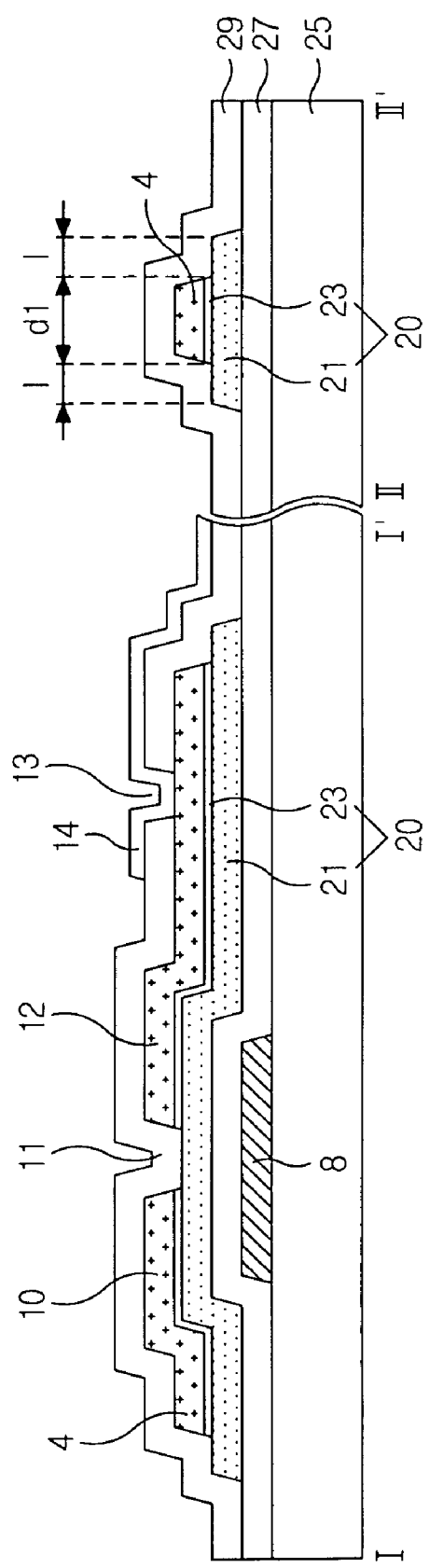
Figure 4:
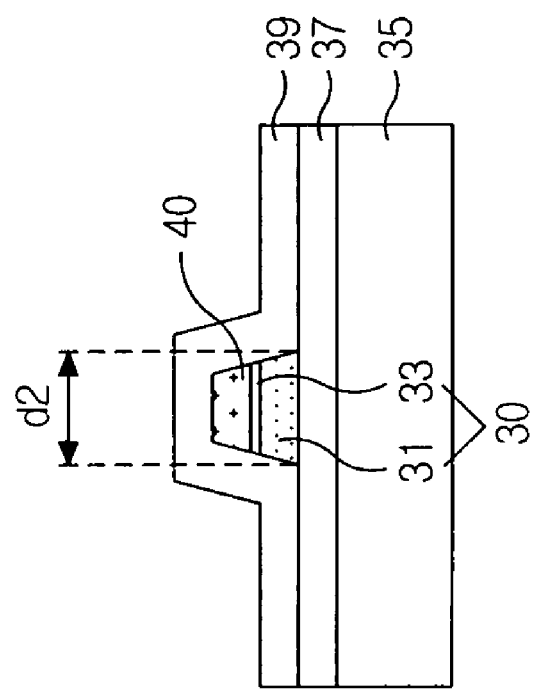
FIG. 4 is a sectional view showing a portion of a thin film transistor array substrate of a liquid crystal display device fabricated by a related art five-round mask process.
Figure 5:
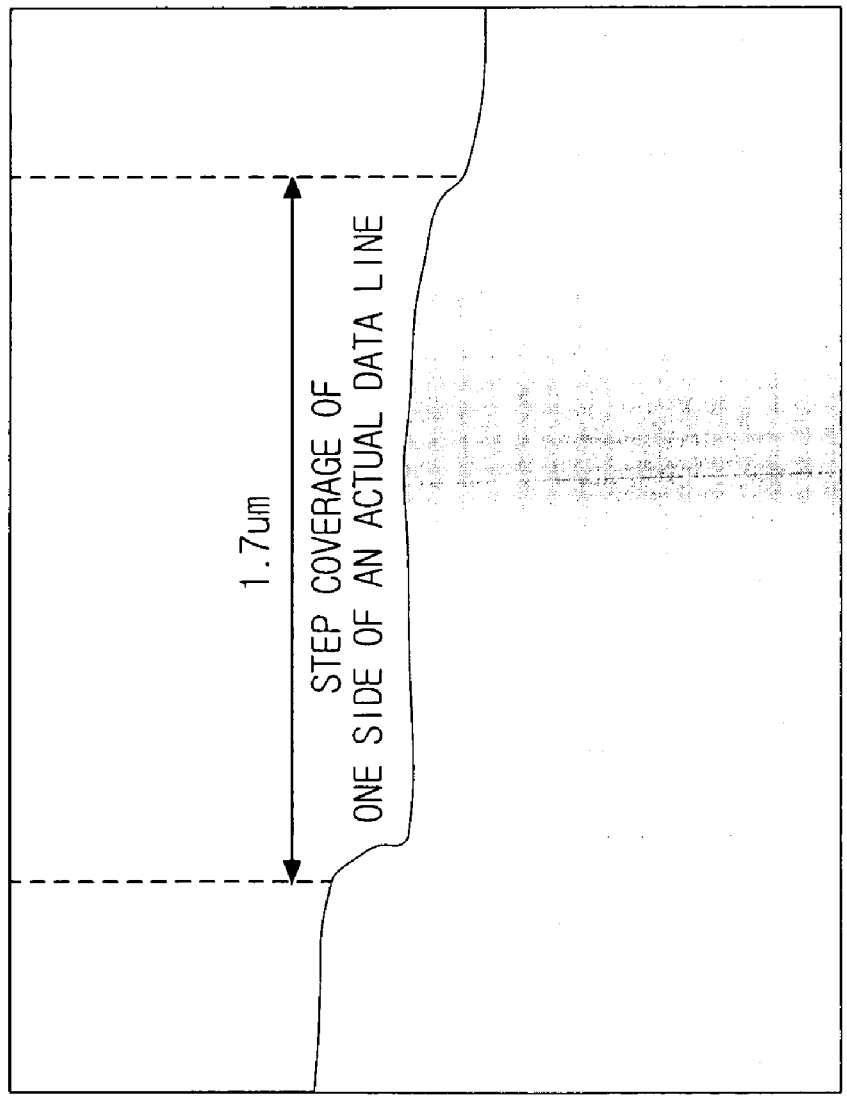
FIG. 5 is a diagram showing one side of an actual data line formed by the related art four-round mask process.
Figure 6:
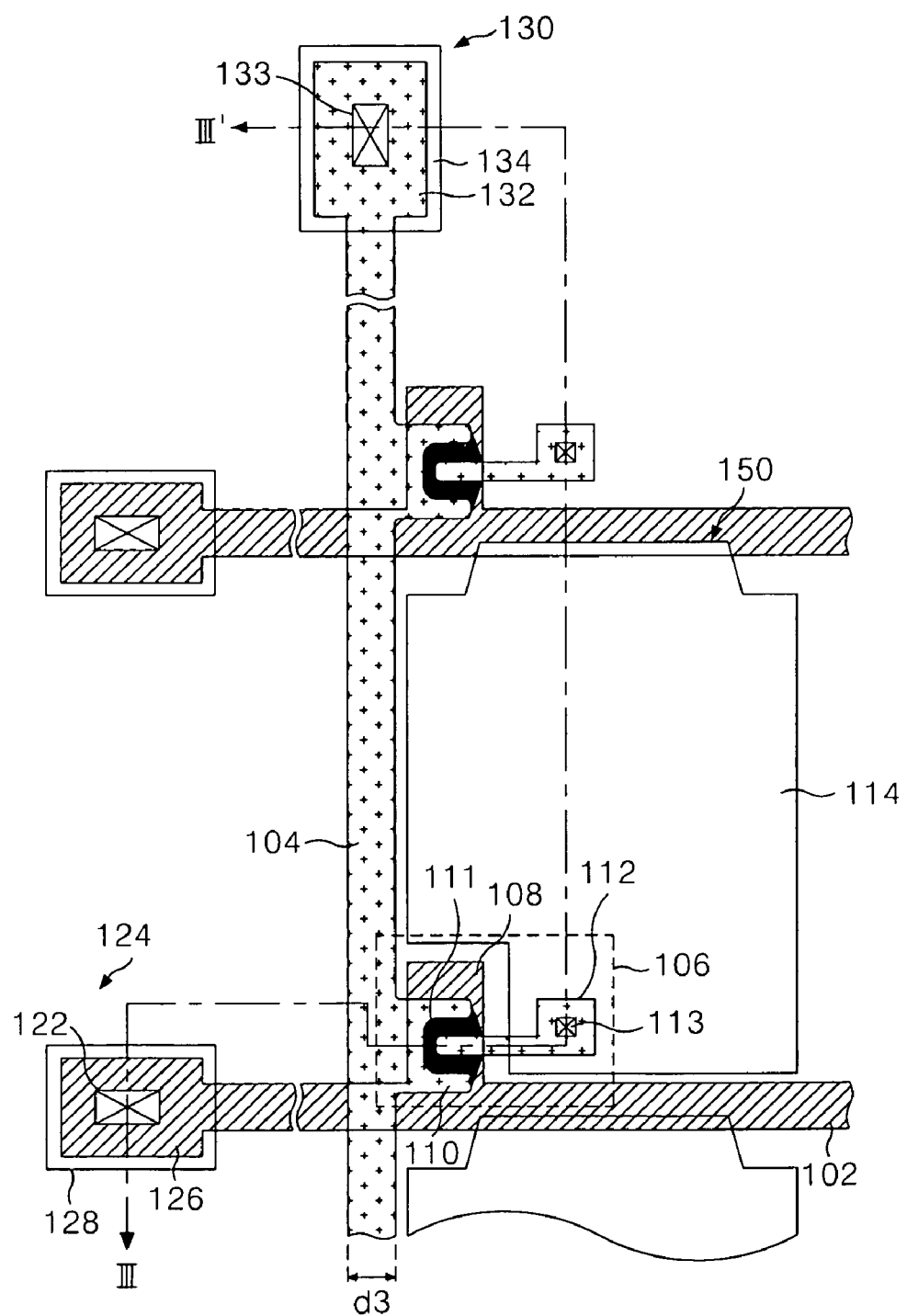
FIG. 6 is a plan view showing a portion of a thin film transistor array substrate of a liquid crystal display device according to the present invention.
Figure 7:
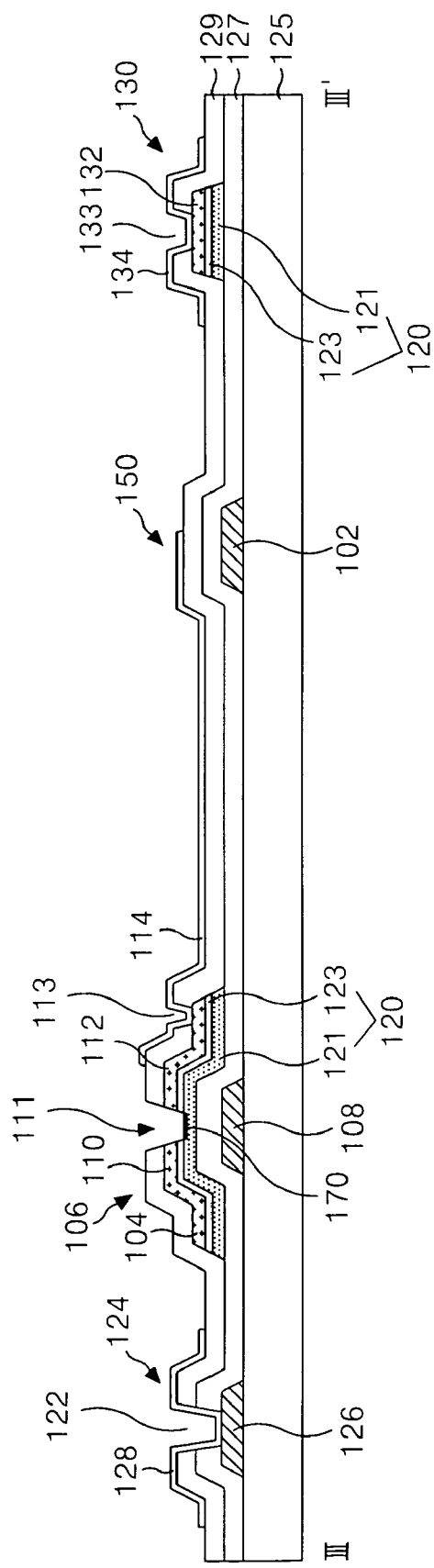
FIG. 7 is a sectional view of the thin film transistor array substrate taken along III-III' in FIG. 6.

FIG. 6 is a plan view showing a portion of a thin film transistor array substrate of a liquid crystal display device according to the present invention, and FIG. 7 is a sectional view of the thin film transistor array substrate taken along III-III' in FIG. 6.

Referring to FIG. 6 and FIG. 7, the thin film transistor array substrate includes a gate line 102 and a data line 104 provided on a lower substrate 125 to intersect each other with a gate insulating film 127 therebetween, a thin film transistor 106 provided at each intersection, a pixel electrode 114 provided at a pixel area, a storage capacitor 150 provided at an overlapped portion between the gate line 102 and the pixel electrode 114, a gate pad 124 connected to the gate line 102, and a data pad 130 connected to the data line 104.

The gate line 102 and the data line 104 substantially cross each other to define a pixel area. Herein, the gate line 102 is supplied with a gate signal, and the data line 104 is supplied with a data signal.

The thin film transistor 106 allows a pixel signal applied to the data line 104 to be charged into the pixel electrode 114 and kept in response to a gate signal applied to the gate line 102. The thin film transistor 106 includes a gate electrode 108 connected to the gate line 102, a source electrode 110 connected to the data line 104, a drain electrode 112 connected to the pixel electrode 114. Also, the thin film transistor 106 further includes an active layer 121 overlapping with the gate electrode 108 with a gate insulating film 127 therebetween to define a channel portion 111 between the source electrode 110 and the drain electrode 112.

The active layer 121 is overlapped with the data line 104. On the active layer 121, an ohmic contact layer 123 for making ohmic contact with the data line 104 is formed, the source electrode 110, and the drain electrode 112 are further provided. To protect the active layer 121 of the channel portion 111, a channel protective film 170 is formed at an upper portion of the active layer 121 of the channel portion 111.

The pixel electrode 114 is connected, via a contact hole 113 passing through a protective film 129, to the drain electrode 112 of the thin film transistor 106.

Accordingly, an electric field is formed between the pixel electrode 114 supplied with a pixel signal via the thin film transistor 106 and a common electrode (not shown) supplied with a reference voltage. Liquid crystal molecules arranged between the thin film transistor array substrate and the color filter array substrate are rotated by such an electric field due to dielectric anisotropy. Light transmittance of the pixel area is varied depending upon the extent of rotation of the liquid crystal molecules to implement a gray level scale.

The storage capacitor 150 is comprised of the gate line 102 and the pixel electrode 114. Herein, the pixel electrode 114 is formed along with the gate line 102, the gate insulating film 127, and the protective film 129. The storage capacitor 150 allows a pixel signal charged in the pixel electrode 114 to be stably maintained until the next signal is charged.

The gate pad 124 is connected to a gate driver (not shown) to supply a gate signal to the gate line 102. The gate pad 124 is comprised of a lower gate pad electrode 126 and an upper gate pad electrode 128. Herein, the lower gate pad electrode 126 extends from the gate line 102, and the upper gate pad electrode 128 is connected, via a third contact hole 122 passing through the gate insulating film 127 and the protective film 129, to the lower gate pad electrode 126.

The data pad 130 is connected to a data driver (not shown) to supply a data signal to the data line 104. The data pad 130 is comprised of a lower data pad electrode 132 and an upper data pad electrode 134. Herein, the lower data pad electrode 132 extends from the data line 104, and the upper data pad electrode 134 is connected, via a second contact hole 133 passing through the protective film 129, to the lower data pad electrode 132.

The thin film transistor array substrate having the above-mentioned structure is fabricated by the four-round mask process. A step coverage is not formed between the data line 104 and the semiconductor pattern 120 provided at a lower portion thereof. Thus, aperture ratio is not reduced by step coverage provided between the data line 104 and the semiconductor pattern 120 provided at a lower portion thereof.

The above-mentioned four-round mask process will be described in detail with reference to FIG. 8A to FIG. 13G.

Figure 8A:
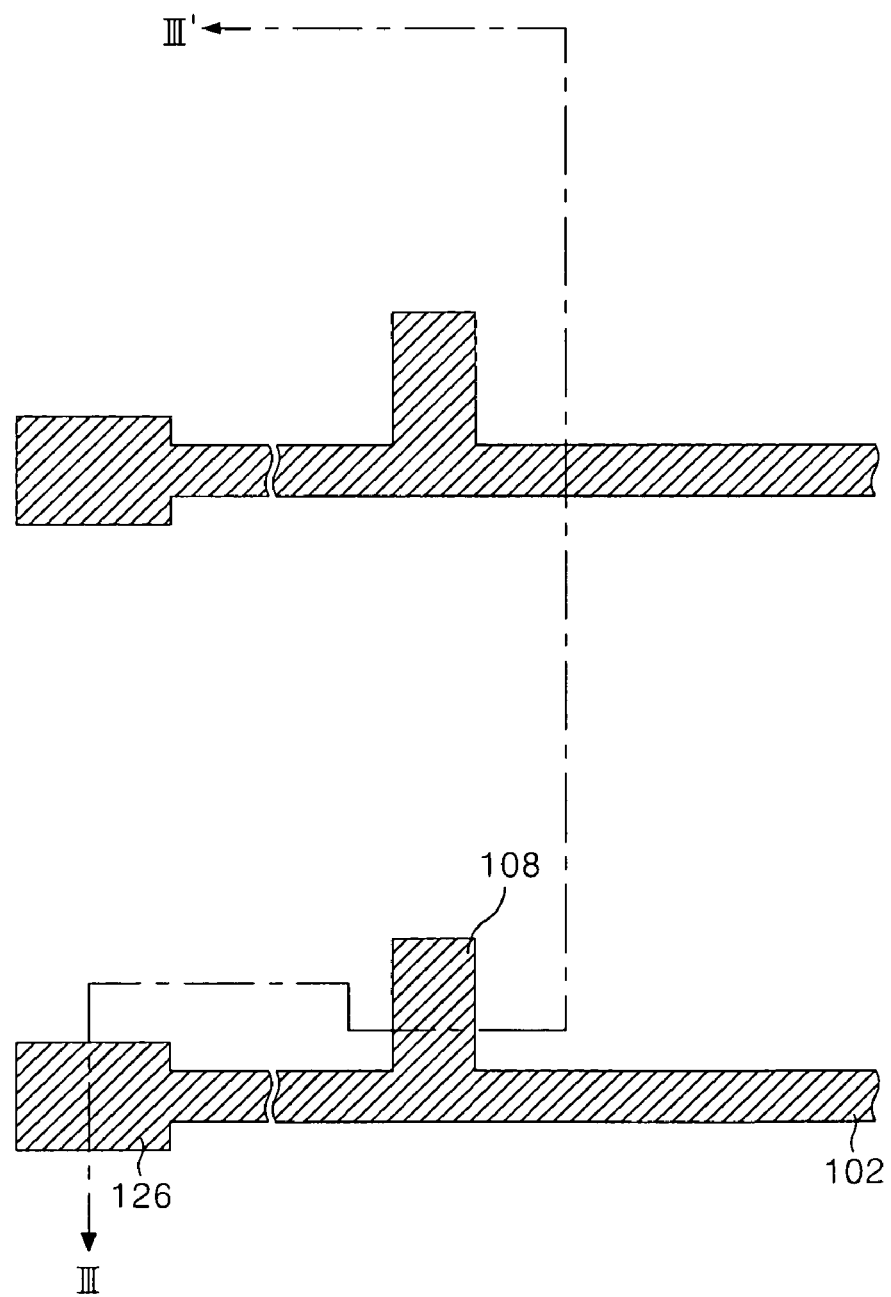
FIG. 8A and FIG. 8B are a plan view and a sectional view for explaining a first mask process in a process of fabricating the thin film transistor array substrate shown in FIG. 6 and FIG. 7, respectively.
Figure 8B:
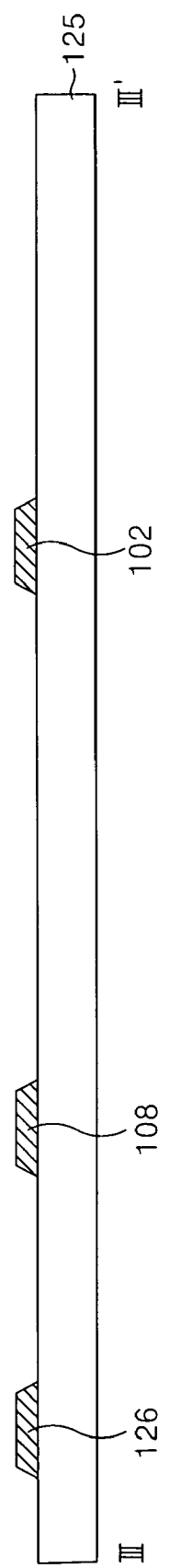

Referring to FIG. 8A and FIG. 8B, a first conductive pattern group is formed on the lower substrate 125 by the first mask process. Herein, the first conductive pattern group includes the lower gate pad electrode 126, the gate electrode 108, and the gate line 102.

More specifically, a gate metal layer is formed on the lower substrate 125 by a deposition technique such as sputtering, etc. Next, the gate metal layer is patterned by photolithography and an etching process using the first mask to provide the first conductive pattern group. Herein, the first conductive pattern group includes the lower gate pad electrode 126, the gate electrode 108, and the gate line 102. In this case, the gate metal layer may be formed from an aluminum group metal, etc.

Figure 9A:
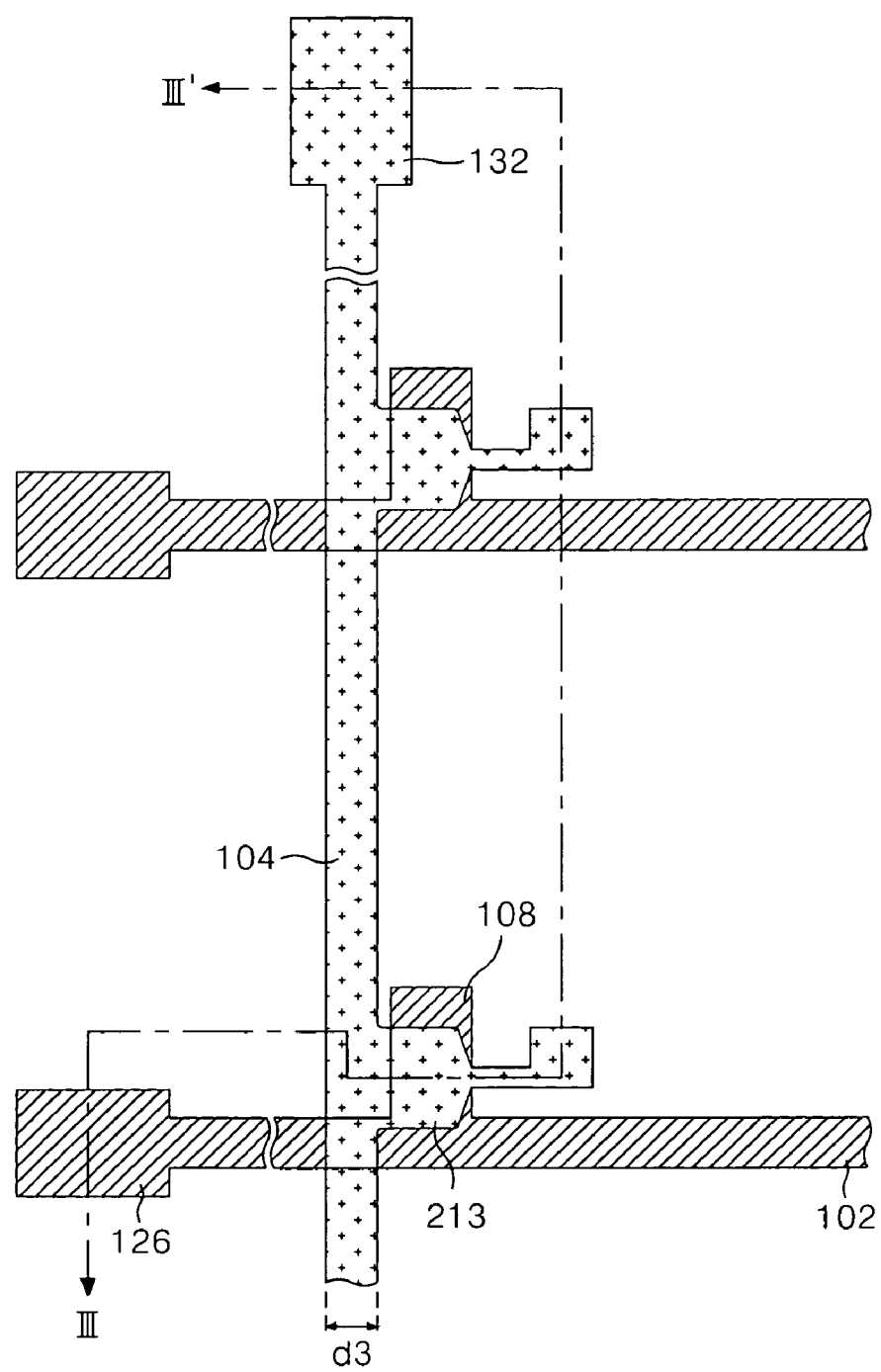
FIG. 9A and FIG. 9B are a plan view and a sectional view for explaining a second mask process in a process of fabricating the thin film transistor array substrate shown in FIG. 6 and FIG. 7, respectively.
Figure 9B:
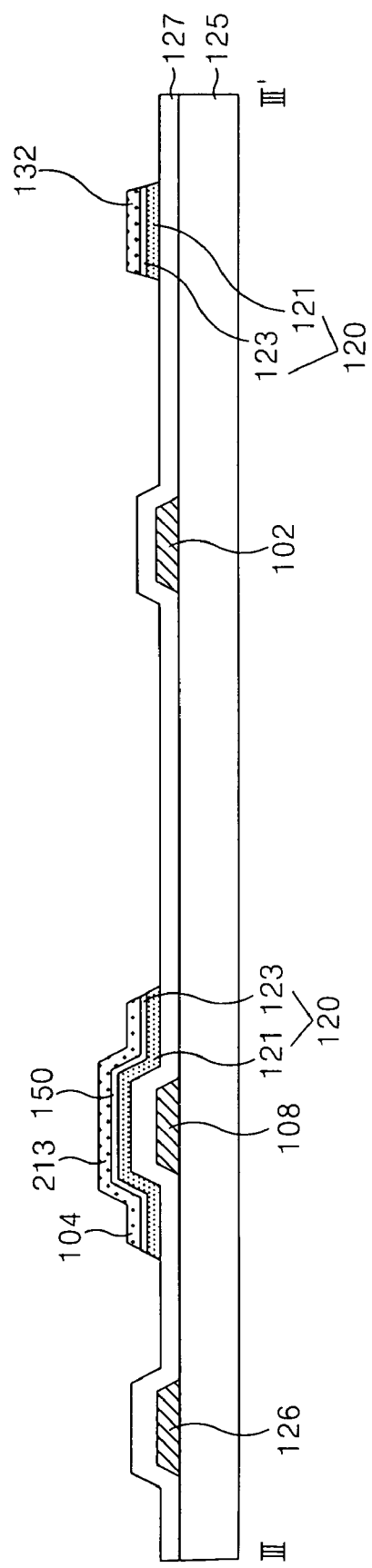

Referring to FIG. 9A and FIG. 9B, the semiconductor pattern 120 and a second conductive pattern group are formed on the lower substrate 125 provided with the first conductive pattern group by the second mask process. Herein, the second conductive pattern group includes a source-drain metal pattern 213, the data line 104, and the lower data pad electrode 132.

Figure 10A:
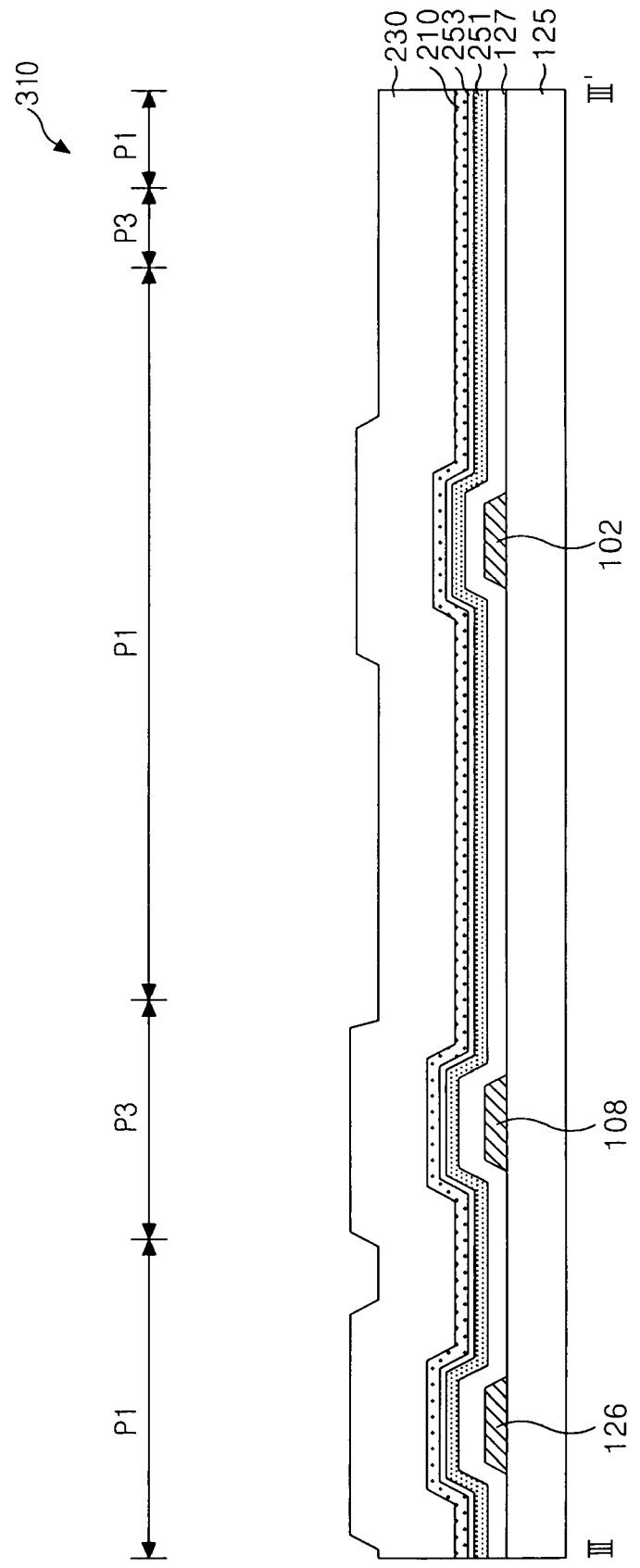
FIG. 10A through and including FIG. 10C are sectional views for explaining step by step the second mask process according to the present invention.

The second mask process will be described in detail with reference to FIG. 10A to 10C. The gate insulating film 127, an amorphous silicon layer 251, an n+ amorphous silicon layer 253 and a source/drain metal layer 210 are sequentially provided on the lower substrate 125 provided with the first conductive pattern group by deposition techniques such as PECVD and the sputtering, etc. Herein, the gate insulating film 127 may be formed from an inorganic insulating material such as silicon oxide ($SiO_x$) or silicon nitride ($SiN_x$). The source/drain metal layer 210 may be formed from Mo, Ti, Ta, and Mo-alloy, etc.

Next, a photo-resist 230 is formed on the source/drain metal layer 210, and then a second mask 310 is aligned at an upper portion of the lower substrate 125. The second mask 310 includes a transmitting area P1 and a shielding area P3. Herein, the transmitting area P1 exposes ultraviolet light and the shielding area P3 shields ultraviolet light.

Figure 10B:
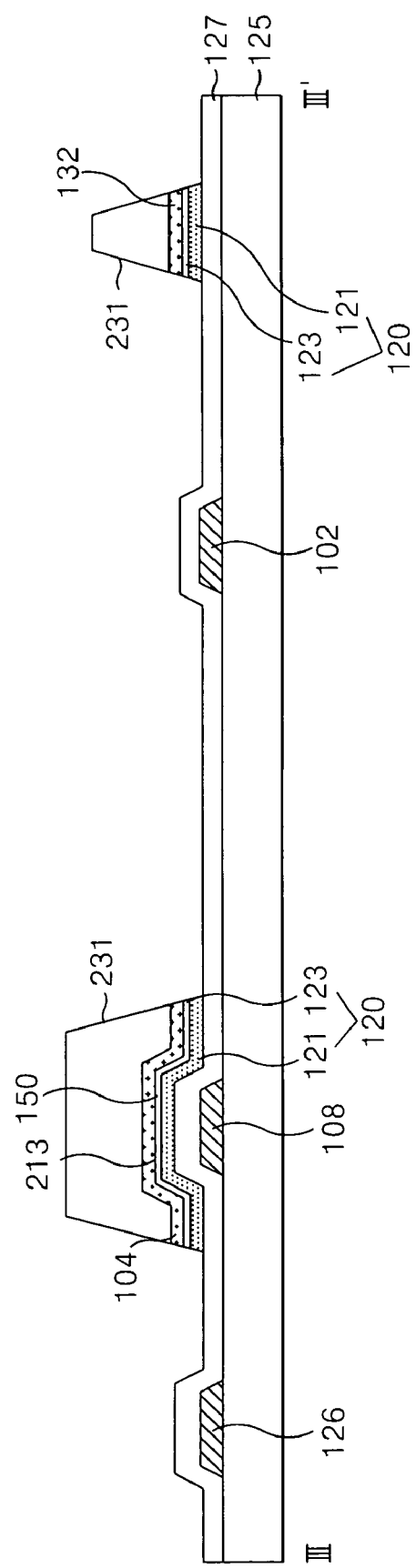

The photo-resist 230 is exposed and developed by the second mask 310 to provide a photo-resist pattern 231 at a portion corresponding to the shielding area P3 of the second mask 310 as shown in FIG. 10B.

The source/drain metal layer 210, the n+ amorphous silicon layer 253, and the amorphous silicon layer 251 are sequentially removed by etching. The source/drain metal layer 210 is exposed by the photo-resist pattern 231, the n+ amorphous silicon layer 253 is provided at a lower portion of the exposed source/drain metal layer 210. For example, the exposed source/drain metal layer 210 is removed by wet-etching, and the n+ amorphous silicon layer 253 and the amorphous silicon layer 251 are removed by dry-etching.

As described above, the source/drain metal layer 210, the n+ amorphous silicon layer 253, and the amorphous silicon layer 251 are sequentially removed by the photo-resist pattern 231 to provide the second conductive pattern group, and to provide the semiconductor pattern 120 at a lower portion of the second conductive pattern group as shown in FIG. 10B. Herein, the second conductive pattern group includes the source-drain metal pattern 213, the data line 104, and the lower data pad electrode 132.

Figure 10C:
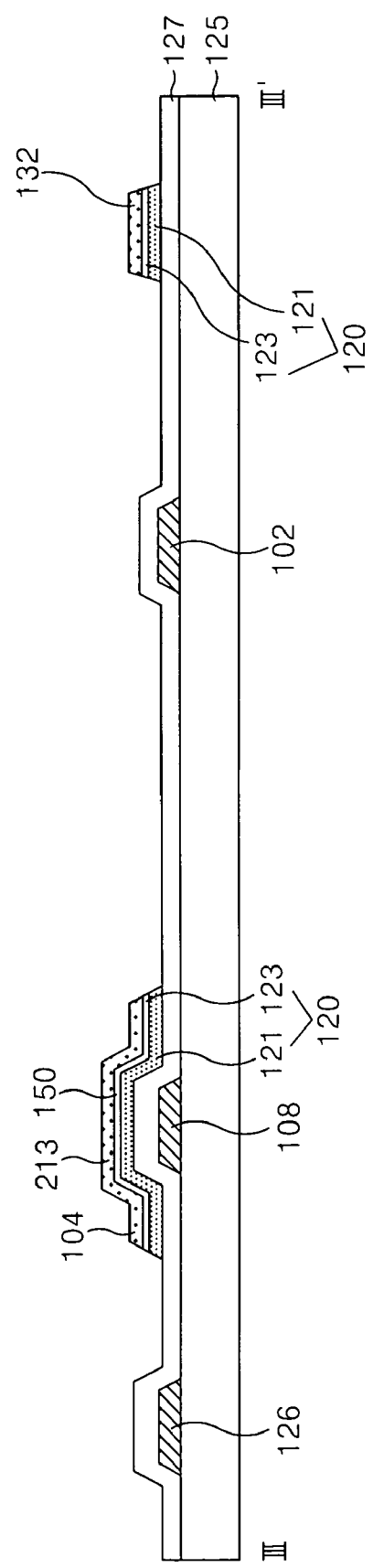

The first photo-resist pattern 231 is removed by stripping as shown in FIG. 10C. Herein, the first photo-resist pattern 231 is left on the second conductive pattern group (not shown).

Figure 11A:
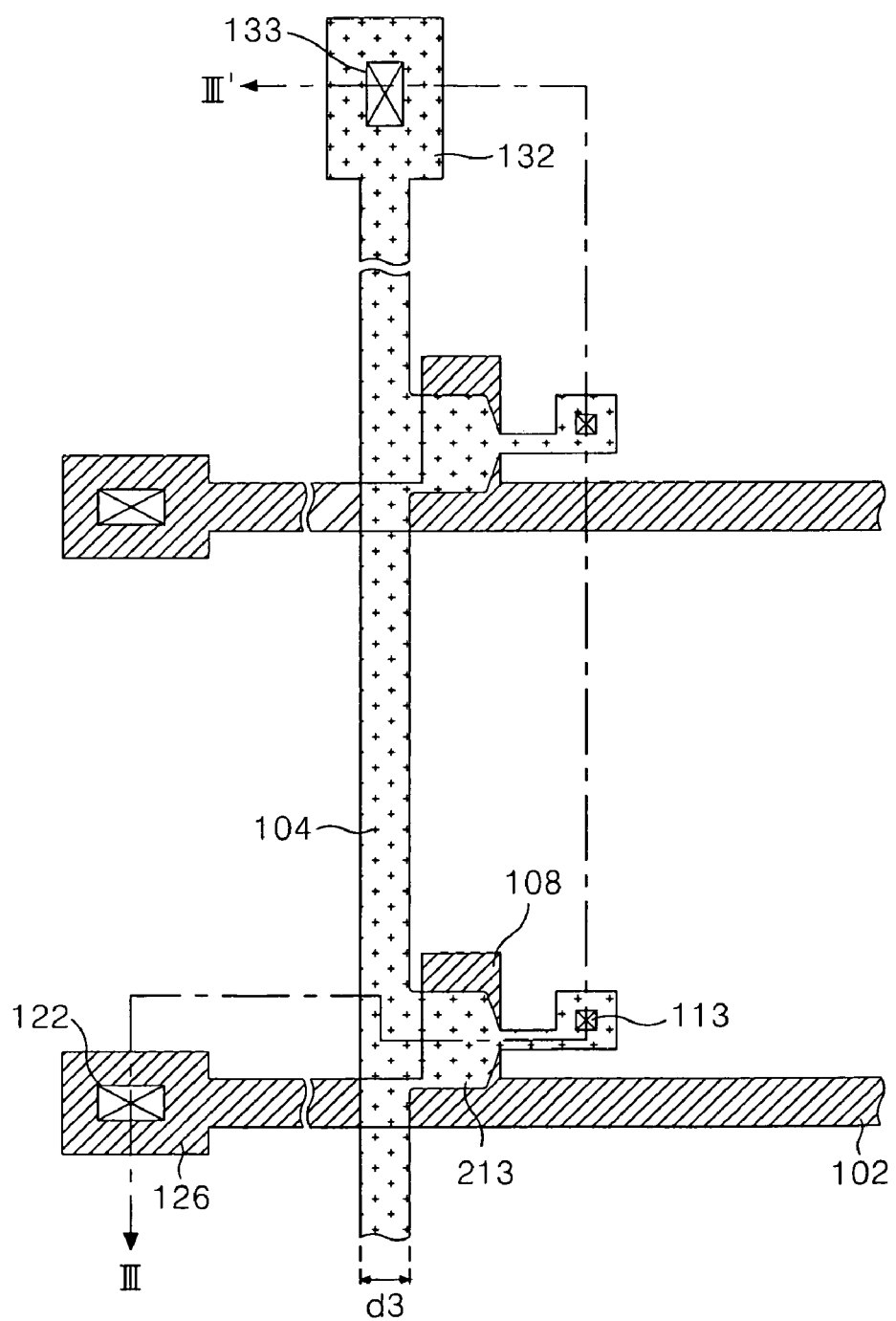
FIG. 11A and FIG. 11B are a plan view and a sectional view for explaining a third mask process in a process of fabricating the thin film transistor array substrate shown in FIG. 6 and FIG. 7, respectively.
Figure 11B:
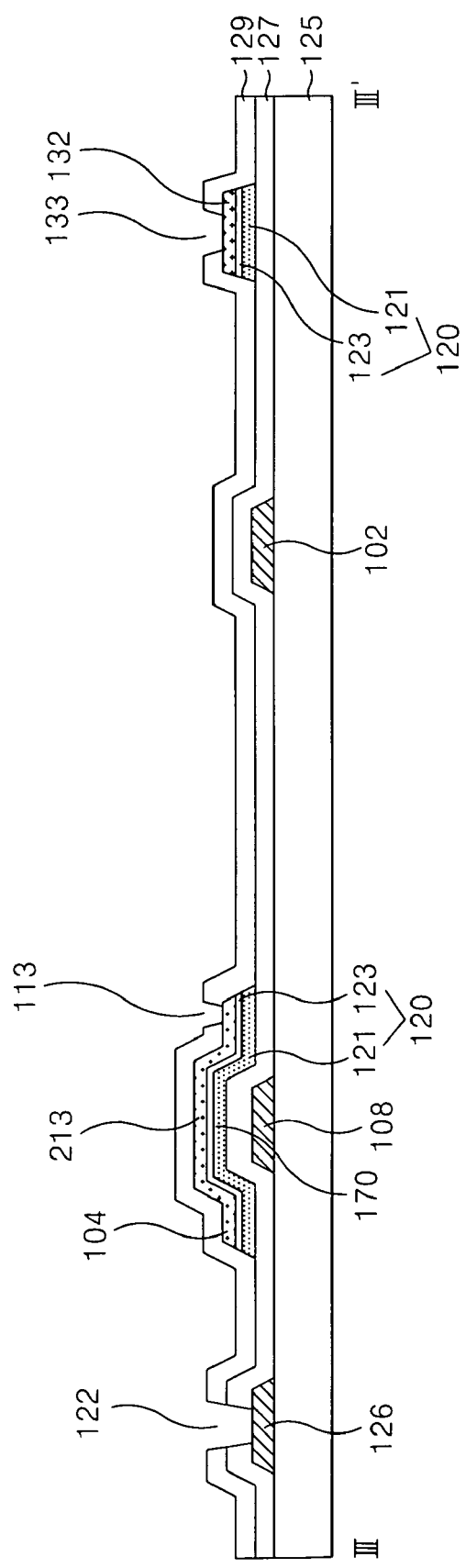

Referring to FIG. 11A and FIG. 11B, the protective film 129 is formed on the gate insulating film 127 provided with the second conductive pattern group by the third mask process. Herein, the protective film 129 includes the first to third contact holes 113, 133, and 122.

More specifically, the protective film is entirely formed on the gate insulating film 127 provided with the second conductive pattern group by a deposition technique such as PECVD, etc. Next, the protective film is patterned by photolithography and etching using the third mask to provide the first to third contact holes 113, 133, and 122.

The first contact hole 113 passes through the protective film 129 to expose the drain electrode. The third contact hole 122 passes through the protective film 129 to expose the lower gate pad electrode 126. The second contact hole 133 passes through the protective film 129 to expose the lower data pad electrode 132. The protective film 129 may be made from an inorganic insulating material substantially identical to the gate insulating film 127, or an organic insulating material such as an acrylic organic compound having a small dielectric constant, BCB or PFCB, etc.

Figure 12A:
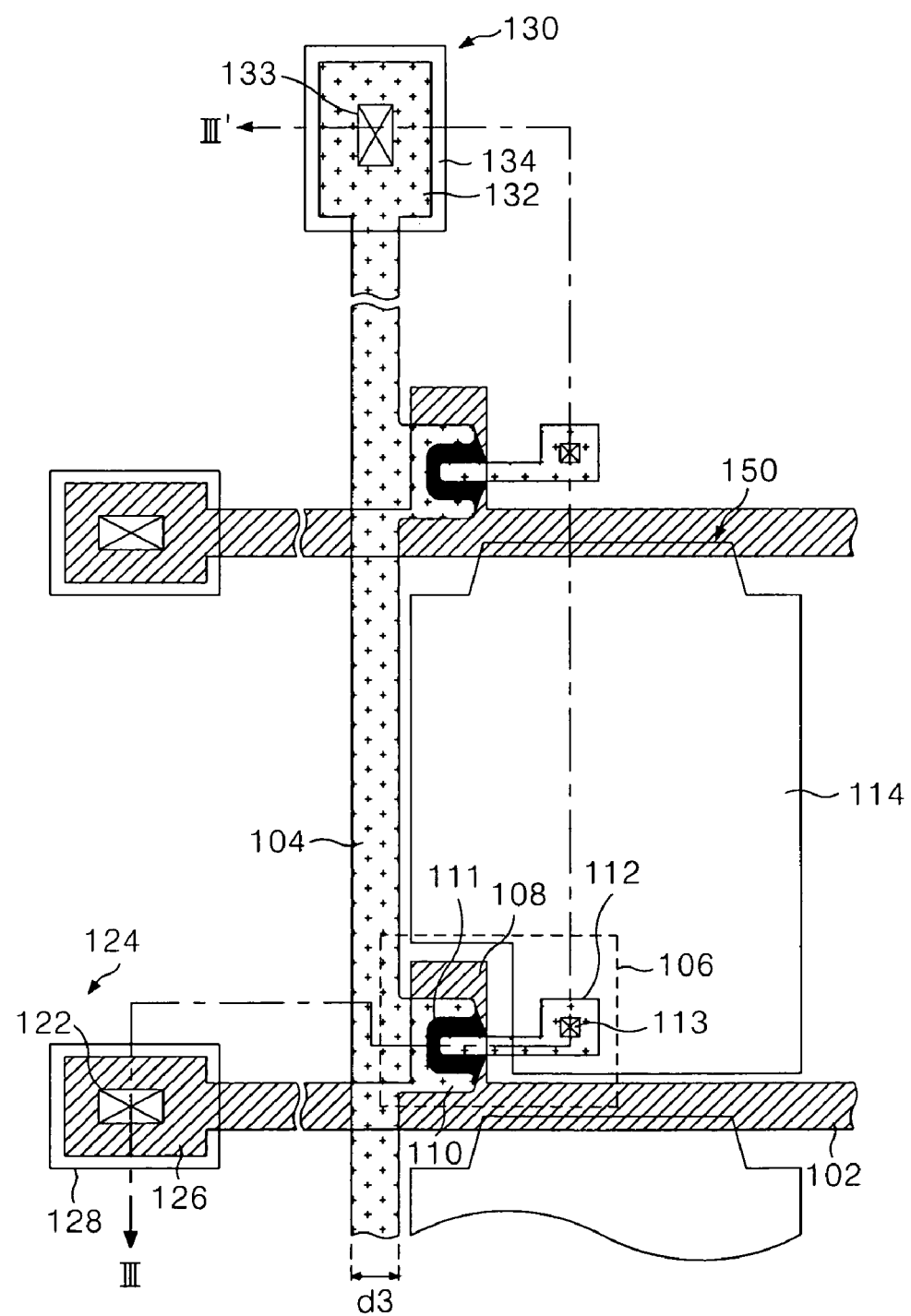
FIG. 12A and FIG. 12B are a plan view and a sectional view for explaining a fourth mask process in a process of fabricating the thin film transistor array substrate shown in FIG. 6 and FIG. 7, respectively.
Figure 12B:
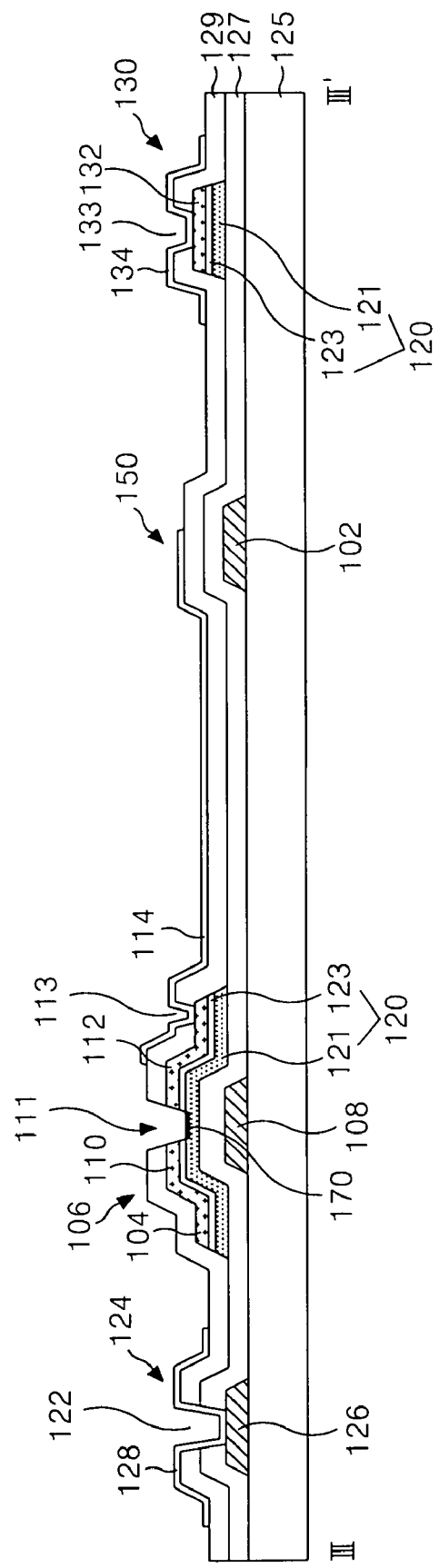

Referring to FIG. 12A and FIG. 12B, a third conductive pattern group is formed on the protective film 129 provided with the first to third contact holes 113, 133, and 122 by the fourth mask process. Herein, the third conductive pattern group includes the upper gate pad electrode 128, the pixel electrode 114, and the upper data pad electrode 134. And, the source electrode 110 and the drain electrode 112 are separated by the fourth mask process, and the channel portion 111 is formed between the source electrode 110 and the drain electrode 112 by the fourth mask process.

Figure 13A:
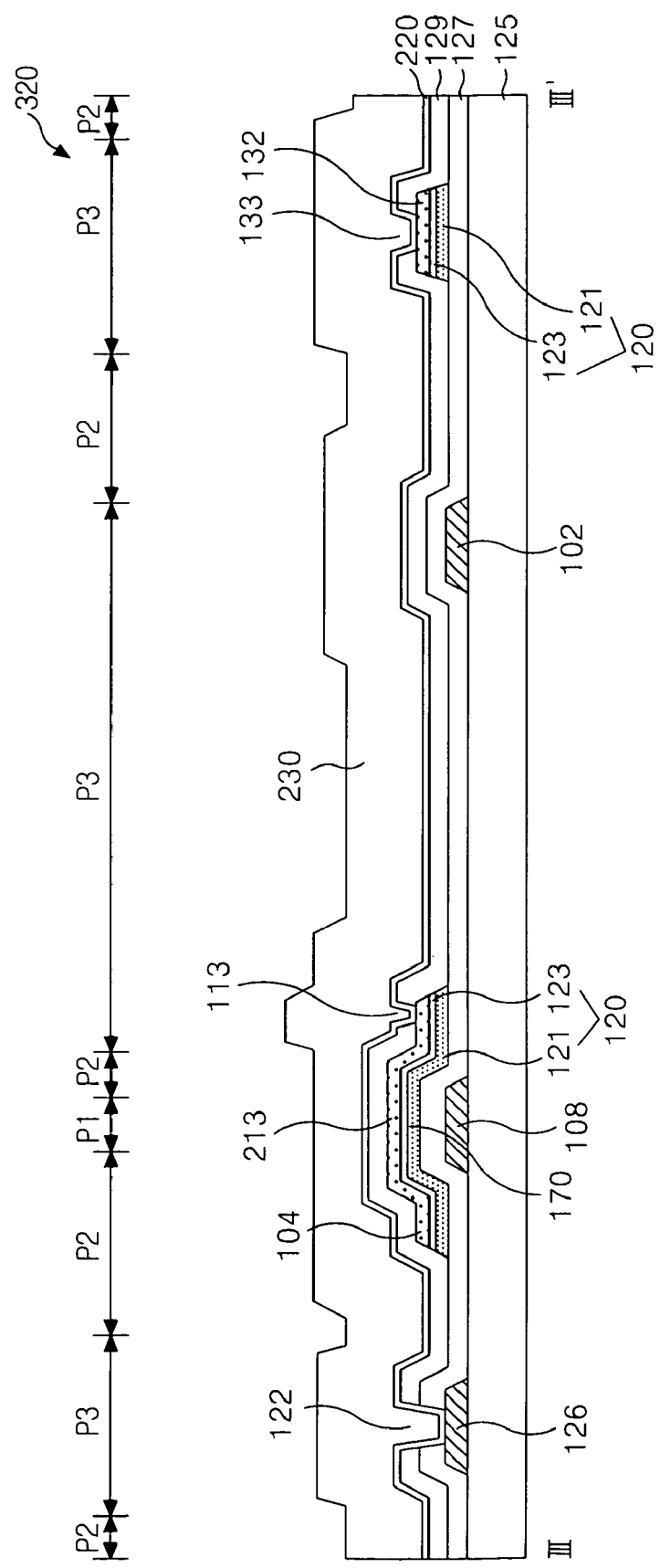
FIG. 13A through and including FIG. 13G are sectional views for explaining step by step the fourth mask process according to the present invention.

The fourth mask process will be described in detail with reference to FIG. 13A to FIG. 13G Referring to FIG. 13A, a transparent conductive film 220 is disposed on the protective film 129 provided with the first to third contact holes 113, 133, and 122 by a deposition technique such as sputtering, etc. Herein, the transparent conductive film 220 may be made from any one of Indium Tin Oxide (ITO), Tin Oxide (TO), Indium Tin Zinc Oxide (ITZO), and Indium Zinc Oxide (IZO). Next, a photo-resist 230 is formed on the transparent conductive film 220, and then a fourth mask 320 is aligned at an upper portion of the lower substrate 125. The fourth mask 320 is comprised of a transmitting area P1 exposing ultraviolet light, a partial transmitting area P2 partially transmitting ultraviolet light, and a shielding area P3 shielding ultraviolet light. The partial transmitting area P2 of the second mask 320 includes a diffractive exposing portion or a half transmitting portion to partially transmit ultraviolet light.

Figure 13B:
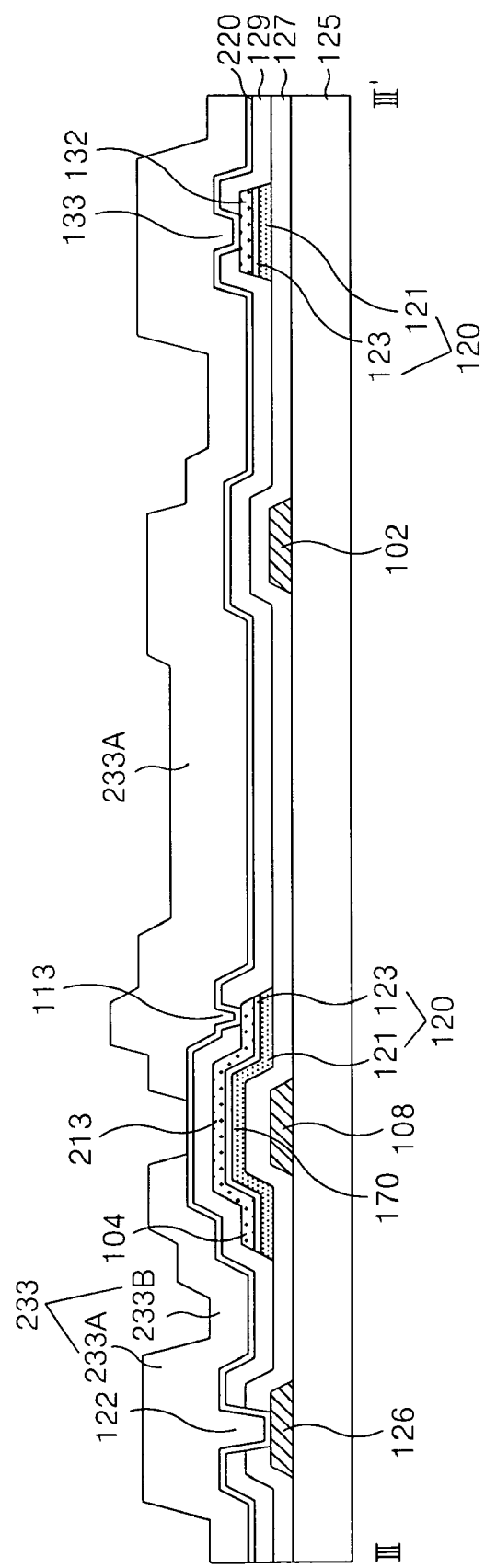

The photo-resist 230 is exposed and developed by the fourth mask 320 to provide a photo-resist pattern 233 having step coverage at a portion corresponding to the shielding area P3 and the partial transmitting area P2 of the fourth mask 320 as shown in FIG. 13B. In other words, a second photo-resist pattern 233B provided at the partial transmitting area P2 has a height substantially lower than a first photo-resist pattern 233A provided at the shielding area P3.

Figure 13C:
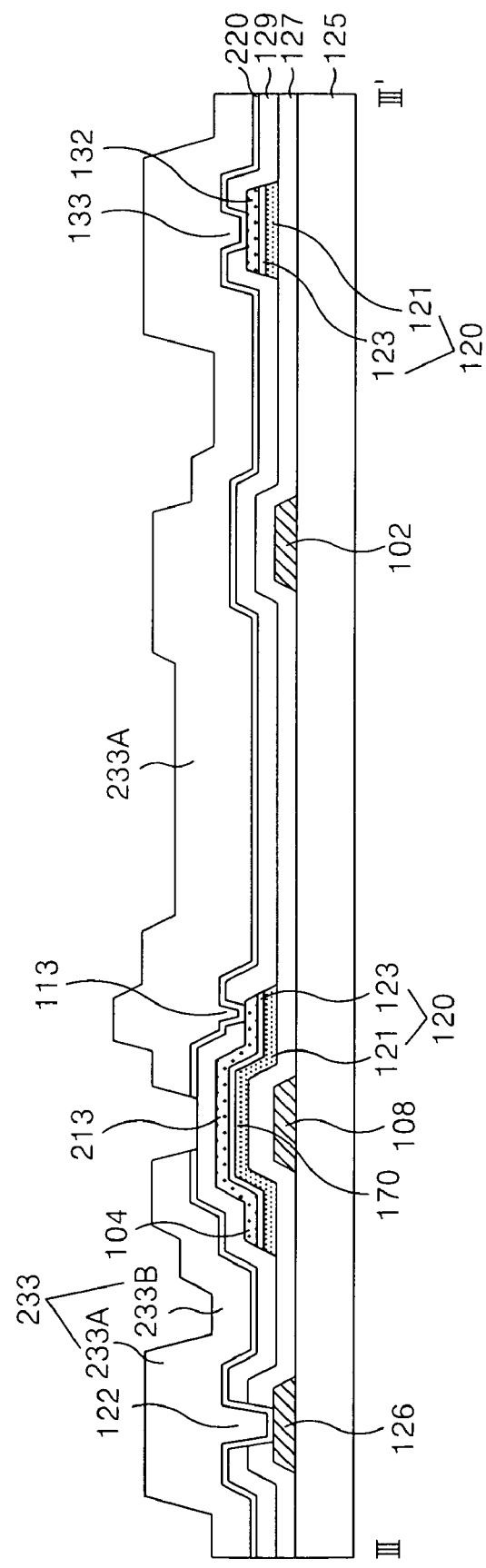

The exposed transparent conductive film 220 is wet-etched by the photo-resist pattern 233 as shown in FIG. 13C. The protective film 129 provided at a lower portion thereof is exposed owing to the transparent conductive film 220 removed by the wet-etching process.

The exposed protective film 129, the source-drain metal pattern provided at a lower portion thereof, and the n+ amorphous silicon layer 123 are removed as shown in FIG. 13D.

For example, the exposed source-drain metal pattern and the semiconductor pattern 120 provided at a lower portion thereof are sequentially removed by dry-etching. The semiconductor pattern 120 removed by dry-etching is the ohmic contact layer 123. Herein, the ohmic contact layer 123 is made from the n+ amorphous silicon. The source electrode 110 and the drain electrode 112 are separated from the source-drain metal pattern by dry-etching as shown in FIG. 13D. The channel portion 111 is formed between the source electrode 110 and the drain electrode 112 by dry-etching. Herein, the channel portion includes the exposed active layer 121. As described above, an ashing process using the plasma gas is carried out on the lower substrate provided with the source electrode 110, the drain electrode 112, and the channel portion 111.

Figure 13E:
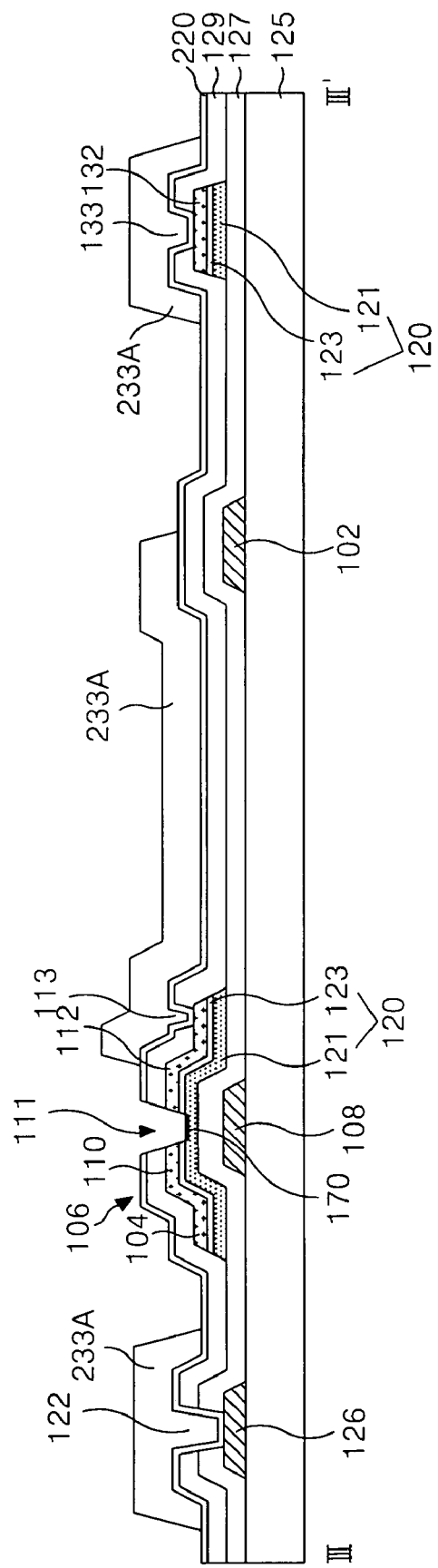

The channel protective film 170 is formed at a surface of the exposed active layer by ashing using the plasma gas as shown in FIG. 13E. For example, an oxide film ($SiO_2$) is formed at a surface of the active layer. In this case, the active layer is exposed by the ashing process using $O_2$ plasma. And, such an oxide film ($SiO_2$) becomes the channel protective film 170. Herein, the channel protective film 170 protects the channel portion 111 from the outside. The channel protective film 170 may be formed by a plasma gas such as $N_2$, $H_2$, etc., other than $O_2$. Also, the first photo-resist pattern 233A is thinned, and the second photo-resist pattern 233B is removed by ashing using the plasma gas as shown in FIG. 13E.

Figure 13F:
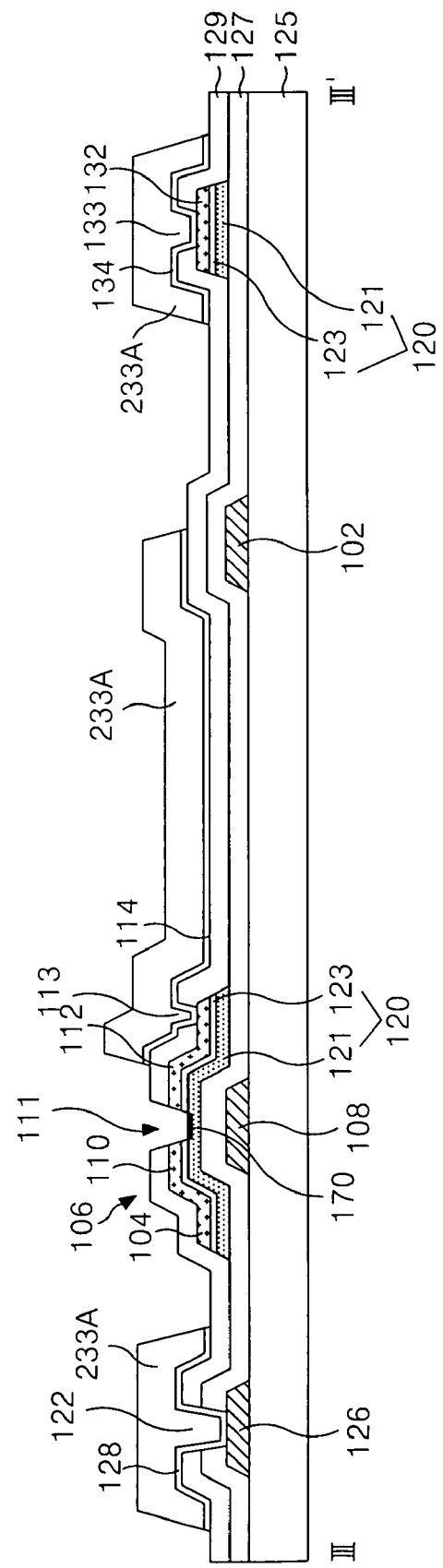

The transparent conductive film 220 is removed by wet-etching using the first ashed photo-resist pattern 233A as shown in FIG. 13F. Herein, the transparent conductive film 220 is exposed by the ashing process of the photo-resist pattern 233. The transparent conductive film 220 exposed by the ashing process is removed to provide the upper gate pad electrode 128, the pixel electrode 114, and the upper data pad electrode 134.

Figure 13G:
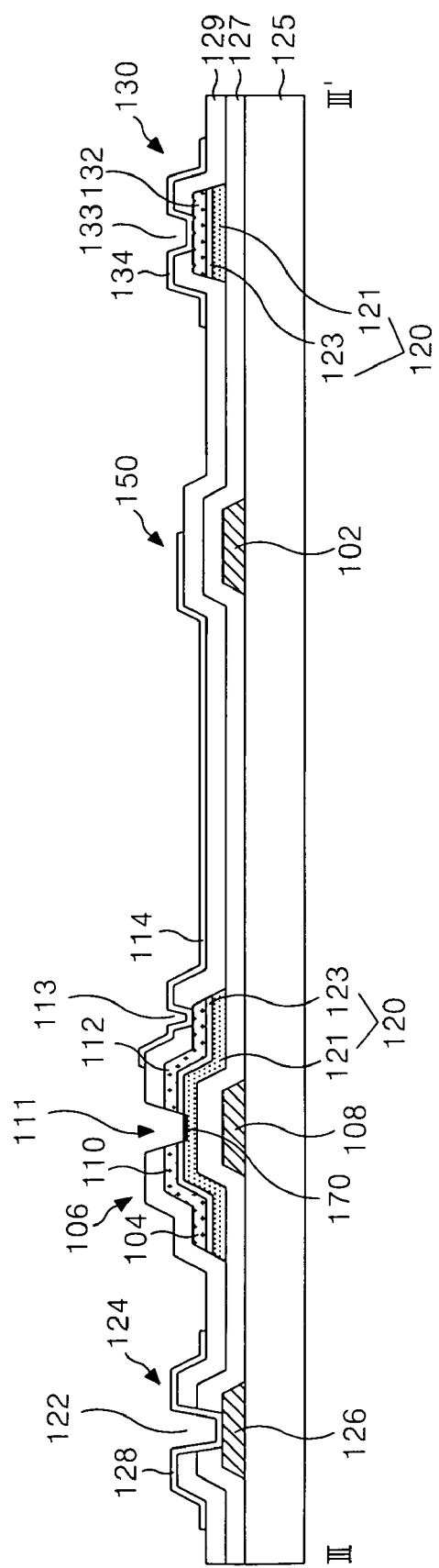

Referring to FIG. 13G, the first photo-resist pattern 233A is removed by stripping. Herein, the first photo-resist pattern 233A is left on the upper gate pad electrode 128, the pixel electrode 114, and the upper data pad electrode 134.

The pixel electrode 114 is electrically connected, via the first contact hole 113, to the drain electrode 112. The upper gate pad electrode 128 is connected, via the third contact hole 122, to the lower gate pad electrode 126. The upper data pad electrode 134 is connected, via the second contact hole 133, to the lower data pad electrode 132.

As described above, a method of fabricating the liquid crystal display device uses the second mask 310 such that ashing is not required. Herein, the second mask 310 includes the transmitting area P1 and the shielding area P3. An etched edge surface of the active layer 121 has no step coverage. The active layer 121 is formed at the data line 104 and the semiconductor pattern 210 fabricated by the second mask process. Herein, the second mask process does not require ashing. The etched edge surface of the active layer 121 may be formed to have a width (d3) of about 3.6 μm to about 4 μm by the related art five-round mask process. Thus, a non-aperture area is not increased. As a result, the aperture ratio of the liquid crystal display device fabricated by the related art five-round mask process is also increased in a liquid crystal display device fabricated by the four-round mask process according to the present invention.

Figure 14:
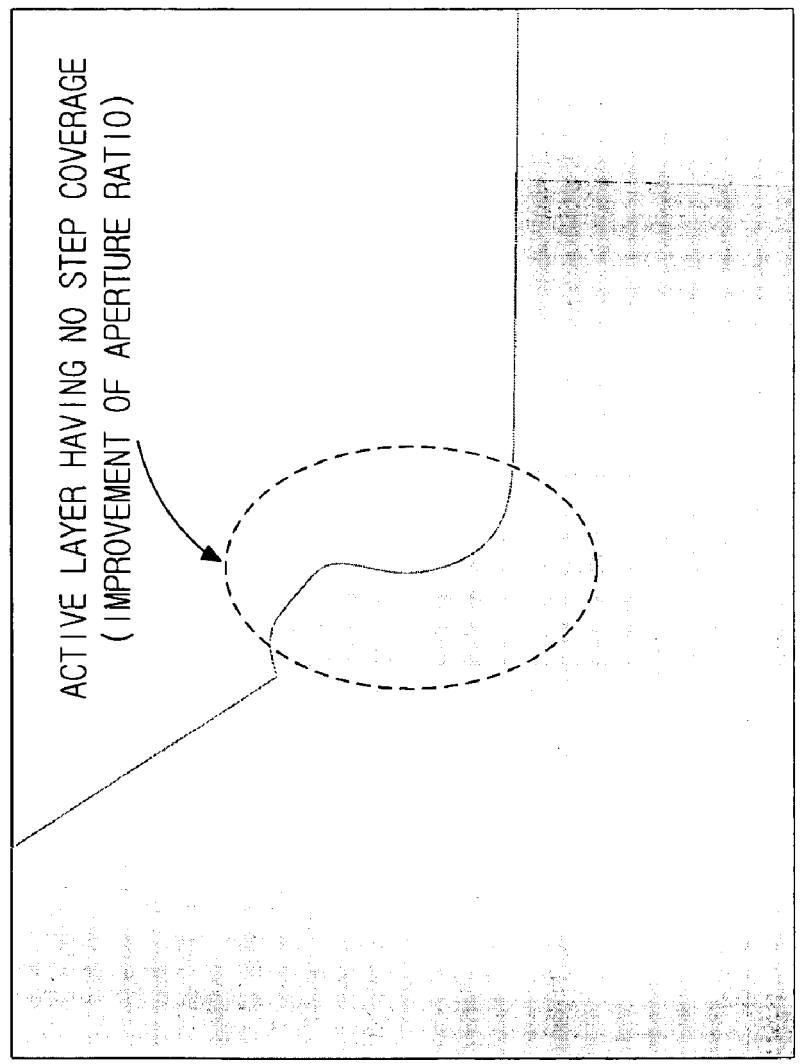
FIG. 14 is a diagram showing one side of an actual data line formed by a four-round mask process according to the present invention.

FIG. 14 is a diagram showing one side of an actual data line formed by a four-round mask process according to the present invention. Referring to FIG. 14, the data line and the etched edge surface have no step coverage. Herein, the data line and the etched edge surface are formed by the four-round mask process according to the present invention.

In the method of fabricating the liquid crystal display device according to the present invention, the fourth mask 320 includes the transmitting area P1, the partial transmitting area P2, and the shielding area P3. Thus, the third conductive pattern group can be formed by one mask. Herein, the third conductive pattern group includes the channel portion 111 of the thin film transistor, the source electrode 110, the drain electrode 112, the pixel electrode 114, the upper gate pad electrode 128, and the upper data pad electrode 134.

The active layer 121 may be surface-treated by plasma gas upon ashing. Herein, the channel portion 111 is formed by the four mask process, and the active layer 121 is exposed by the channel portion 111. The channel protective film 170 is formed on such an active layer 121 to protect the channel portion 111 from the outside.

The liquid crystal display device according to the present invention has no step coverage and may improve a wave noise phenomenon. Herein, such step coverage is substantially formed between the data line 104 and the semiconductor pattern 210 provided at a lower portion thereof in the related art, and the active layer is exposed at both sides of the data line to generate the wave noise phenomenon in the related art.

As described above, the liquid crystal display device and the fabricating method thereof use the second mask 310 does not require ashing. Herein, the second mask 310 includes the transmitting area P1 and the shielding area P3. The data line and the semiconductor pattern have no step coverage. The data line and the semiconductor pattern are fabricated by the second mask process. Herein, the second mask process does not require ashing. The data line and the semiconductor pattern may be formed to have a width of about 3.6 μm to about 4 μm by the related art five-round mask process. Thus, a non-aperture area is not increased. As a result, the aperture ratio of the liquid crystal display device fabricated by the related art five-round mask process is also increased in a liquid crystal display device fabricated by the four-round mask process according to the present invention.

Also, in the liquid crystal display device and the fabricating method thereof according to the present invention, the fourth mask includes the transmitting area, the partial transmitting area, and the shielding area. Thus, the third conductive pattern group can be formed by one mask. Herein, the third conductive pattern group includes the channel portion of the thin film transistor, the source electrode, the drain electrode, the pixel electrode, the upper gate pad electrode, and the upper data pad electrode.

The active layer may be surface-treated by the plasma gas upon ashing. Herein, the channel portion is formed by the four mask process, and the active layer is exposed by the channel portion. The channel protective film is formed on such an active layer to protect the channel portion from the outside.

Also, the liquid crystal display device and the fabricating method thereof according to the present invention have no step coverage to improve a wave noise phenomenon. Such step coverage is substantially formed between the data line 104 and the semiconductor pattern 210 provided at a lower portion thereof in the related art, and the active layer is exposed at both sides of the data line to generate the wave noise phenomenon in the related art.

It will be apparent to those skilled in the art that various modifications and variations can be made according to the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device, comprising:
    forming a first conductive pattern group including a gate line and a gate electrode connected to the gate line on a lower substrate using a first mask;
    forming a gate insulating film covering the first conductive pattern group;

forming a semiconductor pattern having an active layer and an ohmic contact layer, and a second conductive pattern group including a data line overlapped with the semiconductor pattern and a source-drain metal pattern overlapped with the semiconductor pattern on the gate insulating film using a second mask;

forming a protective film including a first contact hole covering the semiconductor pattern and the second conductive pattern group, and exposing a portion of the source-drain metal pattern using a third mask; and separating a source electrode and a drain electrode from the source-drain metal pattern after forming the protective film, forming a channel portion between the source electrode and the drain electrode, and forming a pixel electrode covering the first contact hole using a fourth mask, wherein the fourth mask includes a transmitting area, a shielding area, and a partial transmitting area, wherein a step of using the fourth mask includes:

sequentially disposing a transparent conductive film and a photo-resist on the protective film;

forming a first photo-resist pattern at a portion corresponding to the shielding area, and a second photo-resist pattern having a height substantially lower than a first photo-resist pattern at a portion corresponding to the partial transmitting area by the exposure process and the development process;

etching the transparent conductive film exposed by the first and second photo-resist patterns to expose the protective film;

etching the exposed protective film, the source-drain metal pattern provided at a lower portion of the exposed protective film, and an ohmic contact layer to expose the active layer;

ashing the first and second photo-resist patterns using a plasma gas to remove the second photo-resist pattern, and to expose the transparent conductive film;

etching the exposed transparent conductive film to pattern; and stripping the first photo-resist pattern, wherein a channel protective film is formed at an upper portion of the exposed active layer by an ashing process using the plasma gas.

2. The method of fabricating the liquid crystal display device as claimed in claim 1, wherein the second mask includes a transmitting area and a shielding area.

3. The method of fabricating the liquid crystal display device as claimed in claim 1, wherein a step of using the second mask includes:

sequentially disposing an amorphous silicon layer, a n+ amorphous silicon layer, a source/drain metal layer, and a photo-resist on the gate insulating film;

forming a photo-resist pattern at a portion corresponding to the shielding area by an exposure process and a development process;

sequentially etching the source/drain metal layer exposed by the photo-resist pattern, the n+ amorphous silicon layer provided at a lower portion of the exposed source/drain metal layer, and the amorphous silicon layer to pattern the second conductive pattern group; and stripping the photo-resist pattern.

4. The method of fabricating the liquid crystal display device as claimed in claim 3, wherein the step of sequentially etching the source/drain metal layer exposed by the photo-resist pattern, the n+ amorphous silicon layer provided at a lower portion of the exposed source/drain metal layer, and the amorphous silicon layer to pattern the second conductive pattern group includes:

wet-etching the exposed source/drain metal layer; and dry-etching the n+ amorphous silicon layer provided at a lower portion of the exposed source/drain metal layer, and the amorphous silicon layer.

5. The method of fabricating the liquid crystal display device as claimed in claim 1, wherein the exposed source-drain metal pattern, and an ohmic contact layer provided at a lower portion of the exposed source-drain metal pattern are etched by a dry-etching process.

6. The method of fabricating the liquid crystal display device as claimed in claim 1, wherein the step of forming the second conductive pattern group is simultaneously carried out with a step of forming a lower data pad electrode connected to the data line.

7. The method of fabricating the liquid crystal display device as claimed in claim 6, wherein the step of forming a protective film including the first contact hole is simultaneously carried out with a step of forming a second contact hole exposing the lower data pad electrode.

8. The method or fabricating the liquid crystal display device as claimed in claim 1, wherein the step of forming the pixel electrode is simultaneously carried out with a step of forming an upper data pad electrode connected to a lower data pad electrode exposed via the second contact hole.

* * * * *